US012805362B2

(12) United States Patent
Tai et al.

(10) Patent No.: US 12,805,362 B2
(45) Date of Patent: Nov. 17, 2026

(54) PACKAGE COMPRISING A SUBSTRATE WITH VIA INTERCONNECT WITH VERTICAL WALLS

(71) Applicant: QUALCOMM Incorporated, San Diego, CA (US)

(72) Inventors: Chiao-Yi Tai, Taoyuan City (TW); Joan Rey Villarba Buot, Escondido, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 419 days.

(21) Appl. No.: 18/470,250

(22) Filed: Sep. 19, 2023

(65) Prior Publication Data

US 2025/0096091 A1 Mar. 20, 2025

(51) Int. Cl.

*H10W 70/685* (2026.01)
*H10W 70/05* (2026.01)
*H10W 70/65* (2026.01)
*H10W 90/00* (2026.01)
*H10W 72/00* (2026.01)
*H10W 72/20* (2026.01)

(52) U.S. Cl.

CPC ......... *H10W 70/685* (2026.01); *H10W 70/05* (2026.01); *H10W 70/095* (2026.01); *H10W 70/65* (2026.01); *H10W 90/00* (2026.01); *H10W 90/701* (2026.01); *H10W 72/07253* (2026.01); *H10W 72/07254* (2026.01); *H10W 72/234* (2026.01); *H10W 72/237* (2026.01); *H10W 72/242* (2026.01); *H10W 72/244* (2026.01); *H10W 90/724* (2026.01)

(58) Field of Classification Search

CPC . H10W 70/05; H10W 70/095; H10W 70/611; H10W 70/635; H10W 70/685; H10W 72/07253; H10W 72/07254; H10W 72/234; H10W 72/237; H10W 72/242; H10W 72/244; H10W 90/724

See application file for complete search history.

(56) References Cited

U.S. PATENT DOCUMENTS

2003/0173676 A1 9/2003 Horikawa
2006/0186524 A1* 8/2006 Aiba .................... H10W 20/42 257/E23.114
2015/0027757 A1 1/2015 Shin et al.
2015/0028486 A1 1/2015 Liu et al.
2015/0092381 A1 4/2015 Zhang
2015/0333004 A1 11/2015 Jomaa et al.
(Continued)

FOREIGN PATENT DOCUMENTS

CN 116525574 A 8/2023

OTHER PUBLICATIONS

International Search Report and Written Opinion—PCT/US2024/045314—ISA/EPO—Oct. 24, 2024.

*Primary Examiner* — Nelson Garces
(74) *Attorney, Agent, or Firm* — Loza & Loza, LLP

(57) ABSTRACT

A substrate comprising at least one dielectric layer, and a plurality of interconnects located at least partially in the at least one dielectric layer, wherein the plurality of interconnects include a plurality of via interconnects, and wherein the plurality of via interconnects include a first via interconnect comprising a first via wall that is approximately vertical.

18 Claims, 20 Drawing Sheets

PROFILE CROSS SECTIONAL VIEW

(56) References Cited

U.S. PATENT DOCUMENTS

| | | | | |
|---|---|---|---|---|
| 2018/0145051 | A1 | 5/2018 | Loo et al. | |
| 2020/0013706 | A1* | 1/2020 | Kang | H10W 70/685 |
| 2022/0046801 | A1 | 2/2022 | Kasai et al. | |
| 2023/0039094 | A1* | 2/2023 | Jang | H10W 70/68 |
| 2023/0078231 | A1 | 3/2023 | Fang et al. | |
| 2023/0178470 | A1 | 6/2023 | Lee | |

* cited by examiner

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

PACKAGE COMPRISING A SUBSTRATE WITH VIA INTERCONNECT WITH VERTICAL WALLS

FIELD

Various features relate to packages and substrates.

BACKGROUND

Packages can include a substrate and integrated devices. The substrate may include a plurality of interconnects. Integrated devices may be coupled to the interconnects of the substrate. There is an ongoing need to improve and increase the number of interconnects traveling through a substrate. while also providing smaller packages.

SUMMARY

Various features relate to packages and substrates.

One example provides a substrate comprising at least one dielectric layer; and a plurality of interconnects located at least partially in the at least one dielectric layer, wherein the plurality of interconnects include a plurality of via interconnects, and wherein the plurality of via interconnects include a first via interconnect comprising a first via wall that is approximately vertical.

Another example provides a package comprising an integrated device; and a substrate coupled to the integrated device. The substrate comprises at least one dielectric layer; and a plurality of interconnects located at least partially in the at least one dielectric layer. The plurality of interconnects include a plurality of via interconnects. The plurality of via interconnects include a first via interconnect comprising a first via wall that is approximately vertical.

Another example provides a method for fabricating a substrate. The method forms a first plurality of interconnects for a first metal layer. The method forms a first plurality of via interconnects coupled to the first plurality of interconnects. The method forms a first dielectric layer around the first plurality of interconnects and the first plurality of via interconnects. The method thins the first dielectric layer. The method forms a second plurality of interconnects for a second metal layer. The second plurality of interconnects are coupled to the first plurality of via interconnects. The second plurality of interconnects are located laterally to part of the first plurality of via interconnects.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a substrate comprising at least one dielectric layer; and a plurality of interconnects located at least partially in the at least one dielectric layer. The plurality of interconnects include a plurality of via interconnects. The plurality of via interconnects include a first via interconnect comprising a first via wall that is approximately vertical and a second via interconnect comprising a second via wall that is approximately vertical. The first via interconnect is directly coupled to and touching the second via interconnect. The use of the via interconnects with approximately vertical walls allows for higher density interconnects in a substrate and a package, enabling higher performances for a package that includes an integrated device.

Exemplary Substrate Comprising Via Interconnects with Vertical Walls

Figure 1:
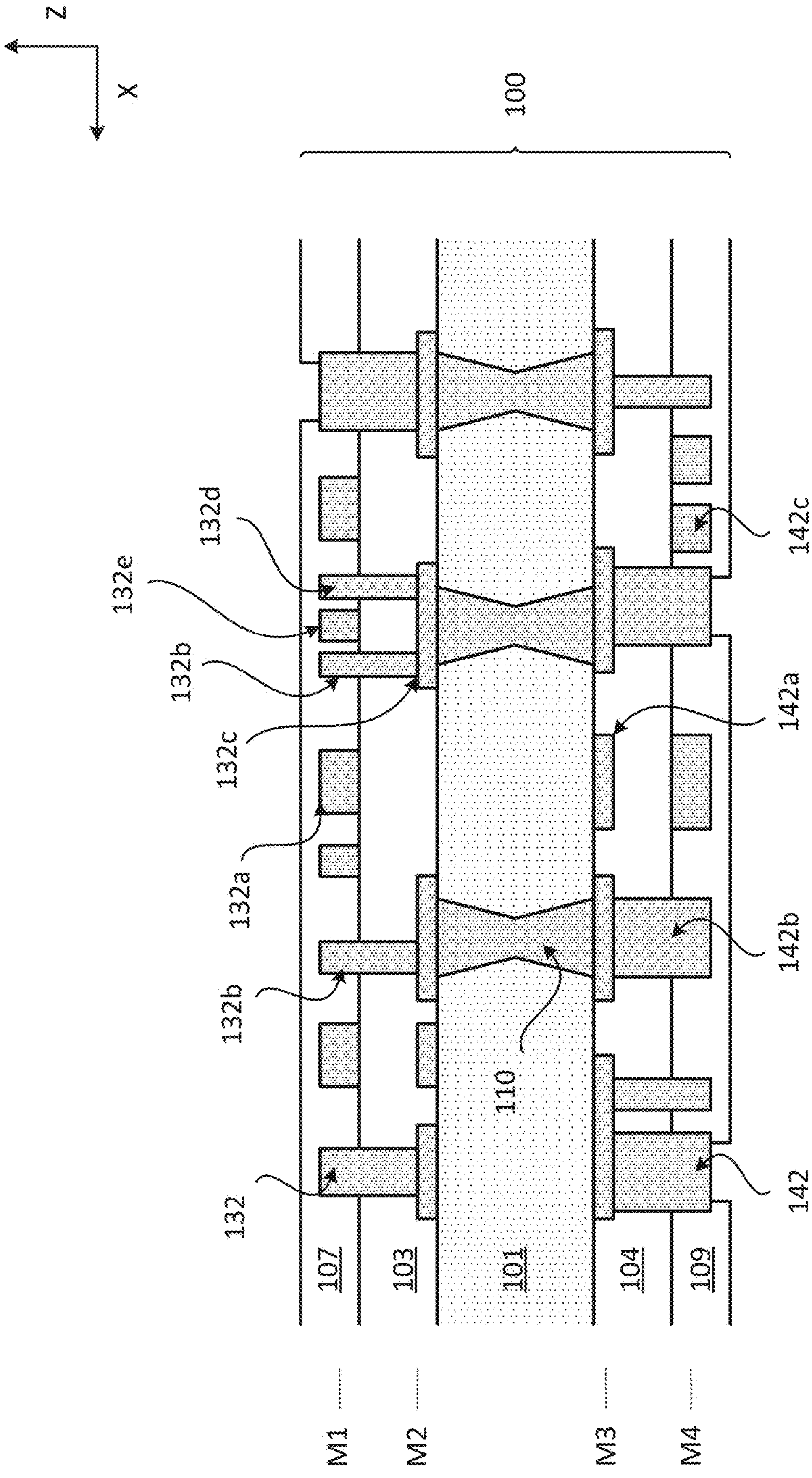
FIG. 1 illustrates an exemplary profile view of a substrate with via interconnects with vertical walls.

FIG. 1 illustrates a profile view of a substrate 100 that includes via interconnects with vertical walls (e.g., vertical via walls). The use of the via interconnects with vertical walls allows for higher density interconnects, as interconnects can be formed closer to each other. Moreover, the via interconnects may be coupled to other via interconnects and/or trace interconnects without pad interconnects. The substrate 100 includes a core layer 101, a dielectric layer 103, a dielectric layer 105, a solder resist layer 107, a solder resist layer 109, a plurality of via interconnects 110, a plurality of interconnects 132 and a plurality of interconnects 142. The dielectric layer 103 and/or the dielectric layer 104 may include a different material from the core layer 101. The dielectric layer 103 and/or the dielectric layer 104 may include prepreg and/or Ajinomoto Build-up Film (ABF).

The plurality of via interconnects 110 is located in the core layer 101. The plurality of via interconnects 110 extend through the core layer 101. The dielectric layer 103 is coupled to a first surface of the core layer 101. The plurality of interconnects 132 are located at least partially in the dielectric layer 103. The plurality of interconnects 132 are coupled to the plurality of via interconnects 110. The solder resist layer 107 is coupled to the dielectric layer 103. The dielectric layer 104 is coupled to a second surface of the core layer 101. The plurality of interconnects 142 are located at least partially in the dielectric layer 104. The plurality of interconnects 142 are coupled to the plurality of via interconnects 110. The solder resist layer 109 is coupled to the dielectric layer 104.

The plurality of interconnects 132 includes a trace interconnect 132*a*, a via interconnect 132*b*, a trace interconnect 132*c*, a via interconnect 132*d* and a trace interconnect 132*e*. The trace interconnect 132*a* is located on a first metal layer (M1). The trace interconnect 132*c* is located on a second metal layer (M2). The trace interconnect 132*c* is coupled to the plurality of via interconnects 110. The via interconnect 132*b* is located between the first metal layer (M1) and the second metal layer (M2). The via interconnect 132*b* may also considered to be located on the first metal layer (M1). The via interconnect 132*b* include a vertical wall (e.g., vertical via wall) that extends from the second metal layer (M2) to and including the first metal layer (M1). The via interconnect 132*b* may be coupled to a trace interconnect (not shown) without the need of a pad interconnect between the via interconnect 132*b* and the trace interconnect. The via interconnect 132*d* is located between the first metal layer (M1) and the second metal layer (M2). The via interconnect 132*d* may also considered to be located on the first metal layer (M1). The via interconnect 132*d* include a vertical wall (e.g., vertical via wall) that extends from the second metal layer (M2) to and including the first metal layer (M1). The via interconnect 132*d* may be coupled to a trace interconnect (not shown) without the need of a pad interconnect between the via interconnect 132*d* and the trace interconnect.

Since via interconnects typically need to have a diameter and/or width that is greater than the width of via interconnect and/or the width of a trace interconnect, eliminating pad interconnects in some circumstances allows via interconnects and/or trace interconnects to be closer to each other. In some implementations, a minimum pitch between two neighboring via interconnects (e.g., 132*b* and 132*d*) may be about 40 micrometers. In some implementations, a pitch between two neighboring via interconnects (e.g., 132*b* and 132*d*) may be about 40 micrometers or greater. In addition, in some implementations, a trace interconnect (e.g., 132*e*) may be located laterally in between two via interconnects (e.g., 132*b*, 132*d*), where the minimum pitch between the two via interconnects (e.g., 132*b*, 132*d*) is approximately 40 micrometers. In some implementations, a trace interconnect (e.g., 132*e*) may be located laterally in between two via interconnects (e.g., 132*b*, 132*d*), where the pitch between the two via interconnects (e.g., 132*b*, 132*d*) is approximately 40 micrometers or greater.

The plurality of interconnects 142 includes a trace interconnect 132*a*, a via interconnect 142*b* and a trace interconnect 142*c*. The trace interconnect 142*a* is located on a first metal layer (M1). The trace interconnect 142*c* is located on a second metal layer (M2). The via interconnect 142*b* is located between the first metal layer (M3) and the fourth metal layer (M4). The via interconnect 142*b* may also considered to be located on the fourth metal layer (M4). The via interconnect 142*b* include a vertical wall (e.g., vertical via wall) that extends from the second metal layer (M3) to and including the first metal layer (M4). The via interconnect 142*b* may be coupled to a trace interconnect (not shown) without the need of a pad interconnect between the via interconnect 142*b* and the trace interconnect. In some implementations, a minimum pitch between two neighboring via interconnects from the plurality of interconnects 142 may be about 40 micrometers. Examples of different dimensions are further shown in at least FIG. 2.

Although only 4 metal layers are shown, the substrate 100 may include additional metal layers. In such instances, in some implementations, via interconnects may be coupled to each other without an intervening pad interconnects. For example a stack of via interconnects may include a first via interconnect coupled to and touching a second via interconnect. The first via interconnect may be located between a third metal layer (M3) and a fourth metal layer (M4), including the fourth metal layer (M4), and the second via interconnect may be located between the fourth metal layer (M4) and a fifth metal layer (M5), including the fifth metal layer (M5).

FIG. 1 illustrates an example of a substrate that includes a core layer. However, in some implementations, a substrate that includes via interconnects with vertical walls (e.g., vertical via walls) may be a coreless substrate.

Figure 2:
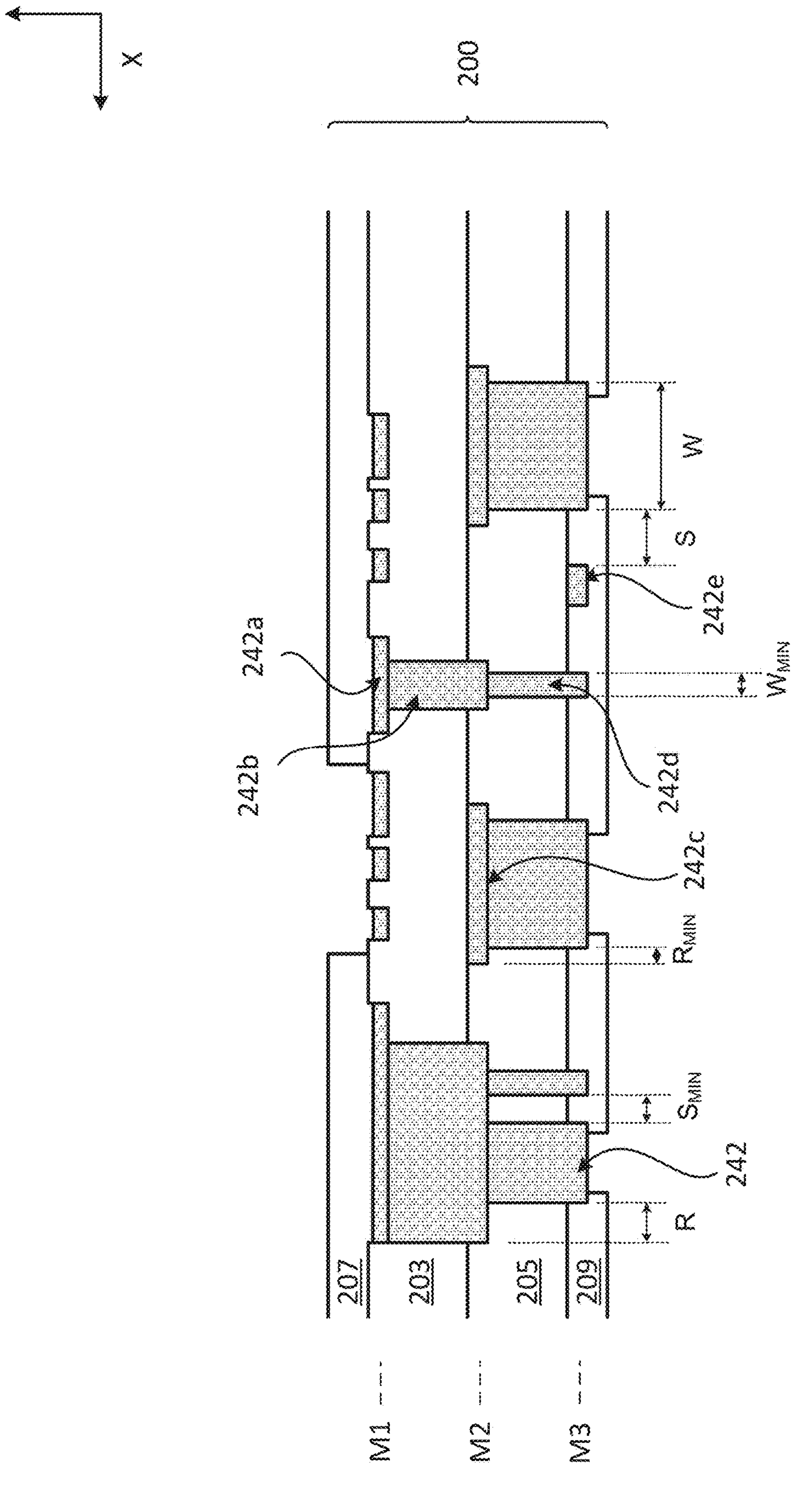
FIG. 2 illustrates an exemplary profile view of another substrate with via interconnects with vertical walls.

FIG. 2 illustrates a profile view of a substrate 200 that includes via interconnects with vertical walls (e.g., vertical via walls). The use of the via interconnects with vertical walls allows for higher density interconnects, as interconnects can be formed closer to each other. Moreover, the via interconnects may be coupled to other via interconnects and/or trace interconnects without pad interconnects. The substrate 200 may be coreless substrate. The substrate 200 includes a dielectric layer 203, a dielectric layer 205, a solder resist layer 207, a solder resist layer 209 and a plurality of interconnects 242. The dielectric layer 203 and/or the dielectric layer 204 may include prepreg and/or Ajinomoto Build-up Film (ABF). It is noted that in some implementations, the dielectric layer 203 and the dielectric layer 205 may be considered as one dielectric layer.

The dielectric layer 203 is coupled to the dielectric layer 205. The solder resist layer 207 is coupled to the dielectric layer 203. The solder resist layer 209 is coupled to the dielectric layer 205. The plurality of interconnects 242 is located at least partially in the dielectric layer 203 and/or the dielectric layer 205.

The plurality of interconnects 242 include a pad interconnect 242*a*, a via interconnect 242*b*, a trace interconnect 242*c*, a via interconnect 242*d* and a trace interconnect 242*e*. The pad interconnect 242*a* is located on a first metal layer (M1) of the substrate 200. The via interconnect 242*b* is located between the first metal layer (M1) and the second metal layer (M2), including the second metal layer (M2). The trace interconnect 242*c* is located on the second metal layer (M2). The via interconnect 242*d* is located between the second metal layer (M2) and the third metal layer (M3), including the third metal layer (M3). The trace interconnect 242*e* is located on the third metal layer (M3). The via interconnect 242*d* is coupled to and touching the via interconnect 242*b*. There is no intervening pad interconnect between the via interconnect 242*d* and the via interconnect 242*b*. The via interconnect 242*d* may have a width and/or diameter that is less than a width and/or a diameter of the via interconnect 242*b*. The via interconnect 242*b* and the via interconnect 242*d* may each have vertical walls (e.g., vertical via walls).

Since via interconnects typically need to have a diameter and/or width that is greater than the width of via interconnect and/or the width of a trace interconnect, eliminating pad interconnects in some circumstances allows via interconnects and/or trace interconnects to be closer to each other. In some implementations, a minimum space ($S_{MIN}$) between two neighboring via interconnects may be about 15 micrometers. In some implementations, a minimum width ($W_{MIN}$) or minimum diameter of an interconnect (e.g., via interconnect) may be about 25 micrometers. In some implementations, a minimum pitch between two neighboring via interconnects may be about 40 micrometers. In some implementations, a minimum registration ($R_{MIN}$) between a pad interconnect and a via interconnect may be about 7.5 micrometers. A minimum registration as used in the disclosure, may be the minimum distance between the edge of a pad interconnect and the wall of the via interconnect that is coupled to and touching the pad interconnect. In some implementations, a minimum registration ($R_{MIN}$) between a first via interconnect and a second via interconnect may be about 7.5 micrometers. A minimum registration as used in the disclosure, may be the minimum distance between the wall of a first via interconnect and the wall of a second via interconnect that is coupled to and touching the first via interconnect. In some implementations, a space(S) between two neighboring via interconnects may be about 15 micrometers or greater. In some implementations, a width (W) or diameter of an interconnect (e.g., via interconnect) may be about 25 micrometers or greater. In some implementations, a pitch (P) between two neighboring via interconnects may be about 40 micrometers or greater. In some implementations, a registration (R) between a pad interconnect and a via interconnect may be about 7.5 micrometers or greater. A registration as used in the disclosure, may be the distance between the edge of a pad interconnect and the wall of the via interconnect that is coupled to and touching the pad interconnect. In some implementations, a registration (R) between a first via interconnect and a second via interconnect may be about 7.5 micrometers or greater. A registration as used in the disclosure, may be the distance between the wall of a first via interconnect and the wall of a second via interconnect that is coupled to and touching the first via interconnect. It is noted that the above dimensions and/or minimum dimensions are applicable to any of the interconnects and/or substrates described in the disclosure. It should be noted that the labeling of the width, space and registration in FIG. 2 is merely exemplary.

Figure 3:
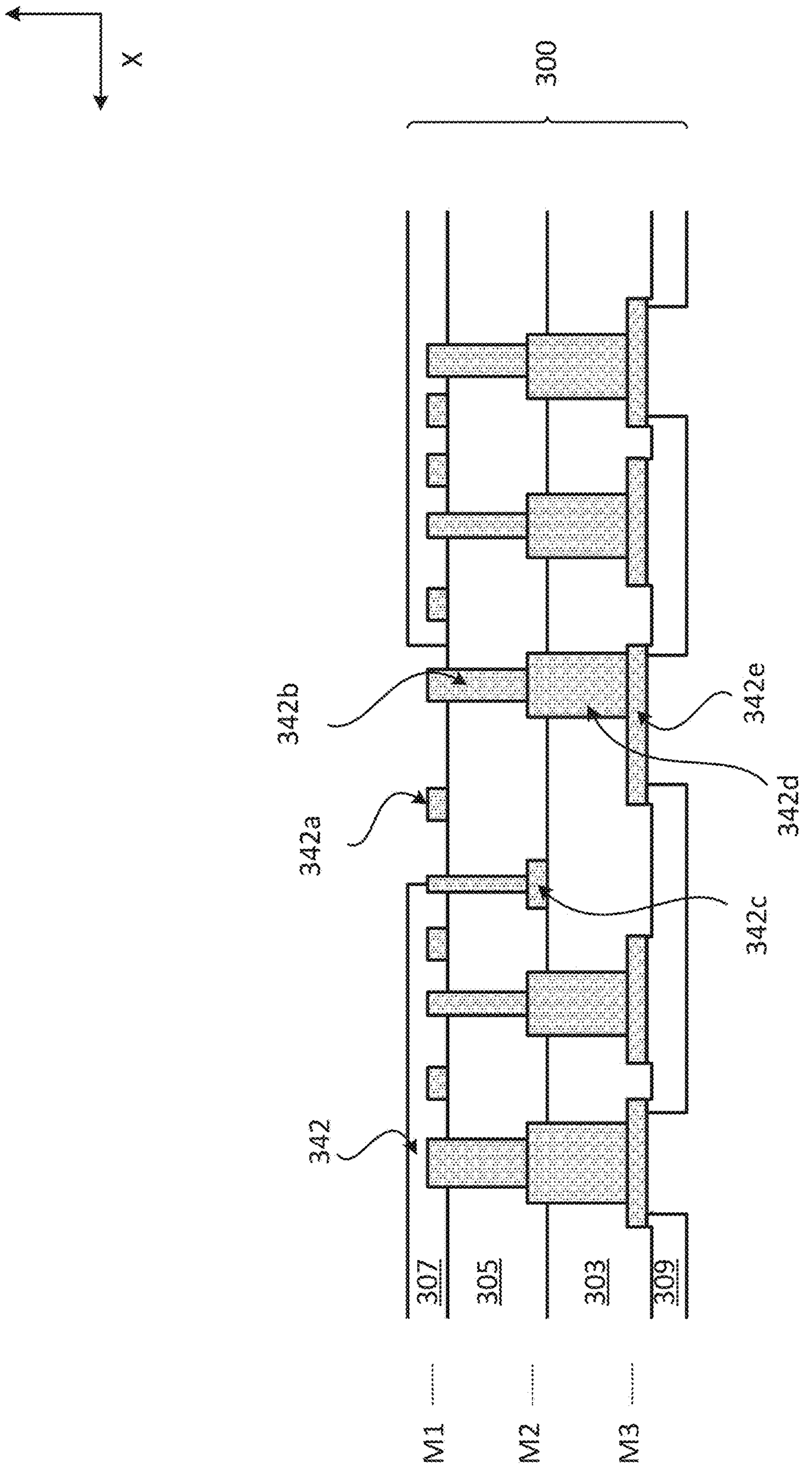
FIG. 3 illustrates an exemplary profile view of another substrate with via interconnects with vertical walls.

FIG. 3 illustrates a profile view of a substrate 300 that includes via interconnects with vertical walls (e.g., vertical via walls). The use of the via interconnects with vertical walls allows for higher density interconnects, as interconnects can be formed closer to each other. Moreover, the via interconnects may be coupled to other via interconnects and/or trace interconnects without pad interconnects. The substrate 300 may be coreless substrate. The substrate 300 includes a dielectric layer 303, a dielectric layer 305, a solder resist layer 307, a solder resist layer 309 and a plurality of interconnects 342. The dielectric layer 303 and/or the dielectric layer 304 may include prepreg and/or Ajinomoto Build-up Film (ABF). It is noted that in some implementations, the dielectric layer 303 and the dielectric layer 305 may be considered as one dielectric layer.

The dielectric layer 303 is coupled to the dielectric layer 305. The solder resist layer 307 is coupled to the dielectric layer 305. The solder resist layer 309 is coupled to the dielectric layer 303. The plurality of interconnects 342 is located at least partially in the dielectric layer 303 and/or the dielectric layer 305.

The plurality of interconnects 342 include a trace interconnect 342*a*, a via interconnect 342*b*, a pad interconnect 342*c*, a via interconnect 342*d* and a pad interconnect 342*e*. The trace interconnect 342*a* is located on a first metal layer (M1) of the substrate 300. The via interconnect 342*b* is located between the first metal layer (M1) and the second metal layer (M2), including the second metal layer (M2). The pad interconnect 342*c* is located on the second metal layer (M2). The via interconnect 342*d* is located between the second metal layer (M2) and the third metal layer (M3), including the third metal layer (M3). The pad interconnect 342*e* is located on the third metal layer (M3). The via interconnect 342*d* is coupled to and touching the via interconnect 342*b*. There is no intervening pad interconnect between the via interconnect 342*d* and the via interconnect 342*b*. The via interconnect 342*d* may have a width and/or diameter that is greater than a width and/or a diameter of the via interconnect 342*b*. The via interconnect 342*b* and the via interconnect 342*d* may each have vertical walls (e.g., vertical via walls).

Since via interconnects typically need to have a diameter and/or width that is greater than the width of via interconnect and/or the width of a trace interconnect, eliminating pad interconnects in some circumstances allows via interconnects and/or trace interconnects to be closer to each other. In some implementations, a minimum pitch between two neighboring via interconnects may be about 40 micrometers. In some implementations, a pitch between two neighboring via interconnects may be about 40 micrometers or greater.

FIGS. 1-3 illustrate examples of substrates that include via interconnects with vertical walls and/or stacked via interconnects without an intervening pad interconnects. In some implementations, a via interconnect and/or a trace interconnect may be coupled to and touching a pad interconnect, while some combinations of first via interconnect and second via interconnect may not have an intervening pad interconnect, and/or some combinations of via interconnect and trace interconnect may not have an intervening pad interconnect. Different implementations may have different numbers of metal layers and a stacked via interconnects may include two or more stacked via interconnects, where the is no pad interconnect between two via interconnects.

Figure 4:
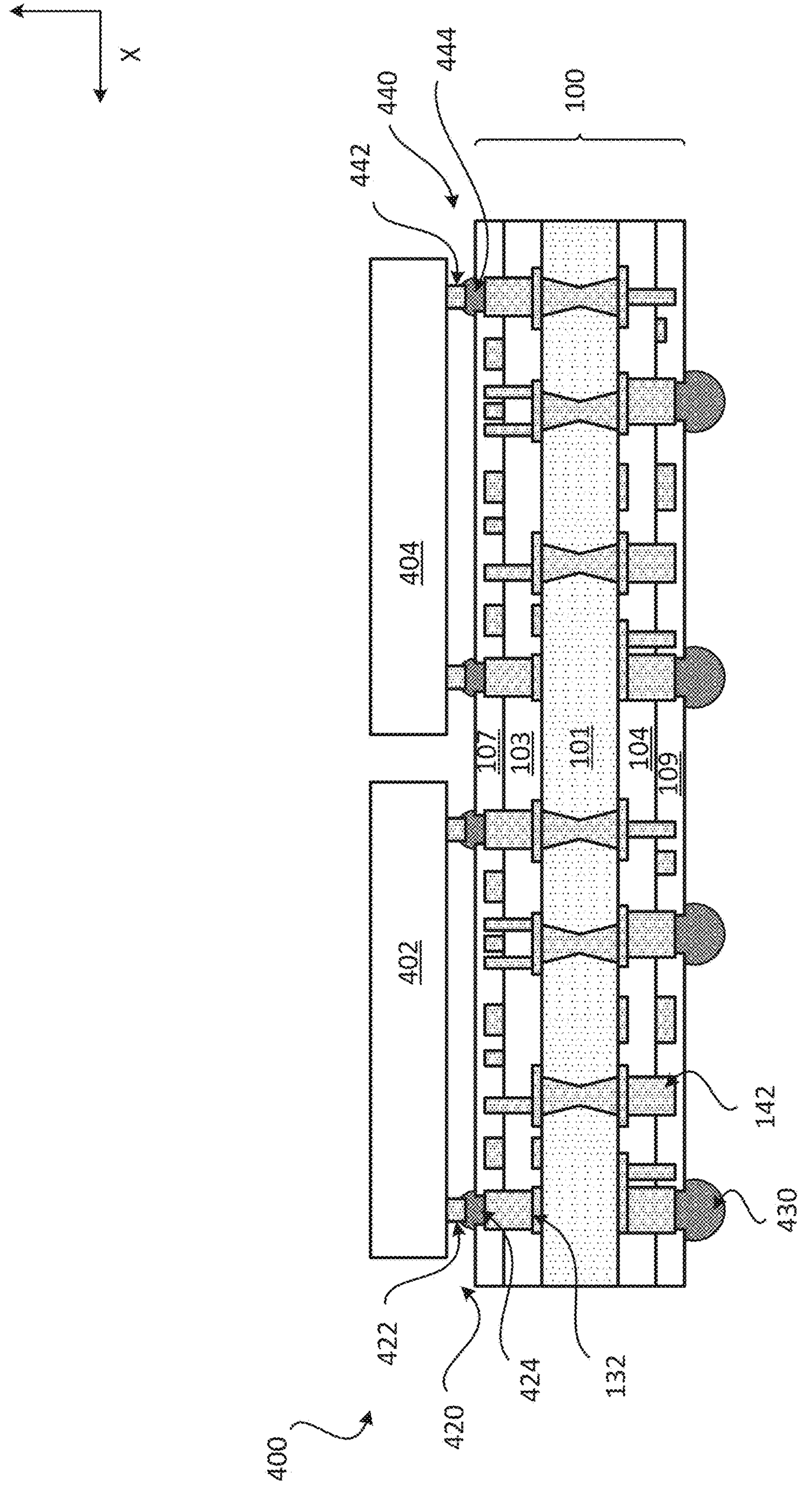
FIG. 4 illustrates an exemplary profile view of a package comprising a substrate with via interconnects with vertical walls.

A vertical wall (e.g., vertical via wall) of a via interconnect, may be a wall that is 90 degrees relative to a surface of a trace interconnect and/or a pad interconnect, that is coupled to the via interconnect. A vertical wall may include walls that are approximately vertical. Thus, for example, a wall of a via interconnect may be vertical if the wall is about 87-93 degrees relative to a surface of a trace interconnect and/or a pad interconnect, that is coupled to and touching the via interconnect. An approximate vertical wall may be a wall that is about 87-93 degrees relative to a surface of a trace interconnect and/or a pad interconnect, that is coupled to and touching the via interconnect FIG. 4 illustrates a package 400 that includes the substrate 100, an integrated device 402 and an integrated device 404. The substrate 100 includes a plurality of via interconnects with vertical walls and/or stacked via interconnects, as illustrated and described in at least in FIG. 1.

The integrated device 402 is coupled to the substrate 100 through a plurality of bump interconnects 420. The plurality of bump interconnects 420 may include a plurality of pillar interconnects 422 and/or a plurality of solder interconnects 424. The plurality of pillar interconnects 422 are coupled to the plurality of solder interconnects 424. The plurality of solder interconnects 424 may be coupled to the plurality of interconnects 132 of the substrate 100. In some implementations, the integrated device 402 is coupled to the substrate 100 through the plurality of solder interconnects 424 without the need of the plurality of pillar interconnects 422.

The integrated device 404 is coupled to the substrate 100 through a plurality of bump interconnects 440. The plurality of bump interconnects 440 may include a plurality of pillar interconnects 442 and/or a plurality of solder interconnects 444. The plurality of pillar interconnects 442 are coupled to the plurality of solder interconnects 444. The plurality of solder interconnects 444 may be coupled to the plurality of interconnects 132 of the substrate 100. In some implementations, the integrated device 404 is coupled to the substrate 100 through the plurality of solder interconnects 444 without the need of the plurality of pillar interconnects 442.

Figure 5:
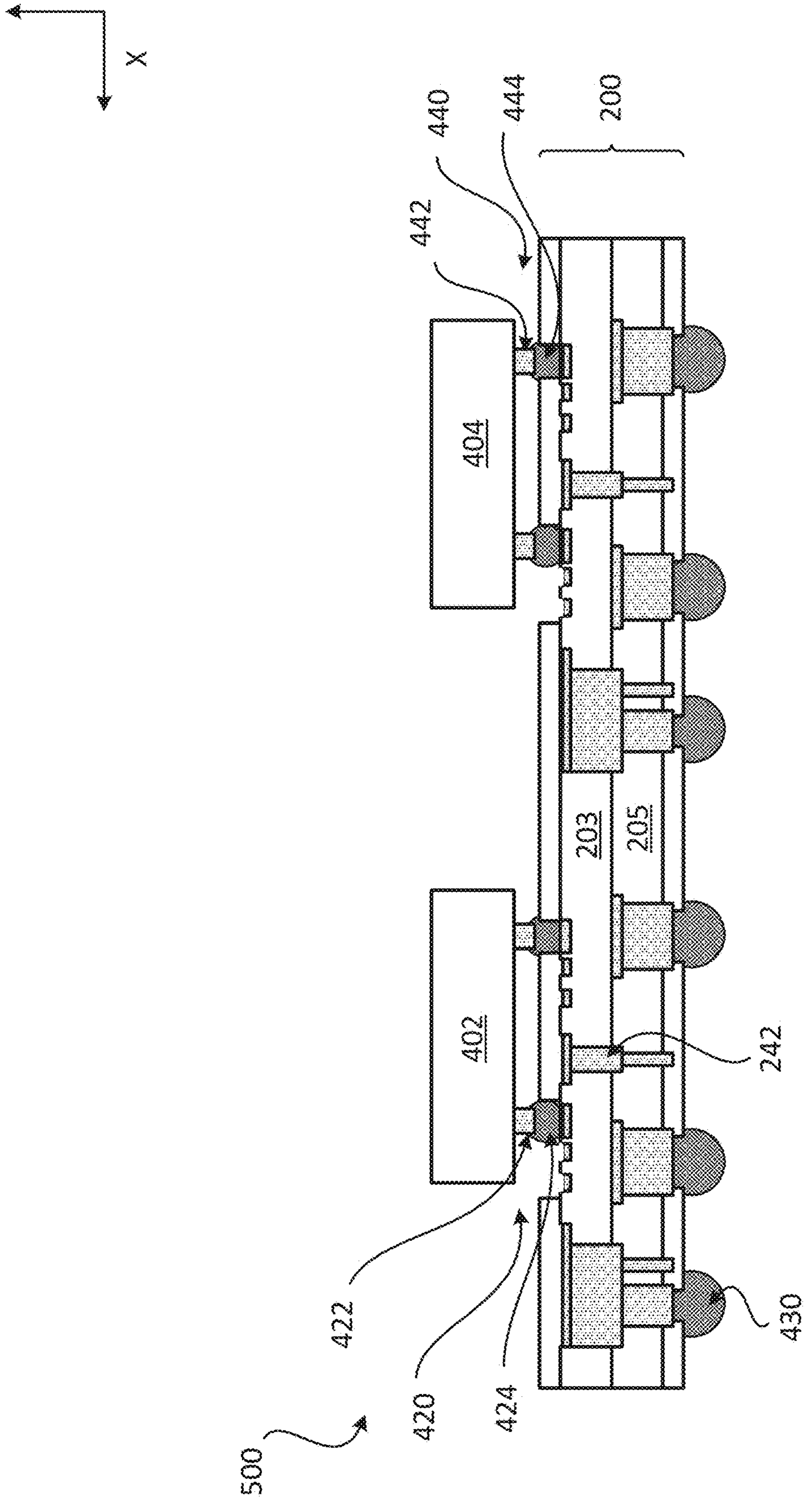
FIG. 5 illustrates an exemplary profile view of another package comprising a substrate with via interconnects with vertical walls.

FIG. 5 illustrates a package 500 that includes the substrate 200, an integrated device 402 and an integrated device 404. The substrate 200 includes a plurality of via interconnects with vertical walls and/or stacked via interconnects, as illustrated and described in at least in FIG. 2.

The integrated device 402 is coupled to the substrate 200 through a plurality of bump interconnects 420. The plurality of bump interconnects 420 may include a plurality of pillar interconnects 422 and/or a plurality of solder interconnects 424. The plurality of pillar interconnects 422 are coupled to the plurality of solder interconnects 424. The plurality of solder interconnects 424 may be coupled to the plurality of interconnects 232 of the substrate 200. In some implementations, the integrated device 402 is coupled to the substrate 200 through the plurality of solder interconnects 424 without the need of the plurality of pillar interconnects 422.

The integrated device 404 is coupled to the substrate 200 through a plurality of bump interconnects 440. The plurality of bump interconnects 440 may include a plurality of pillar interconnects 442 and/or a plurality of solder interconnects 444. The plurality of pillar interconnects 442 are coupled to the plurality of solder interconnects 444. The plurality of solder interconnects 444 may be coupled to the plurality of interconnects 232 of the substrate 200. In some implementations, the integrated device 404 is coupled to the substrate 200 through the plurality of solder interconnects 444 without the need of the plurality of pillar interconnects 442.

Figure 6:
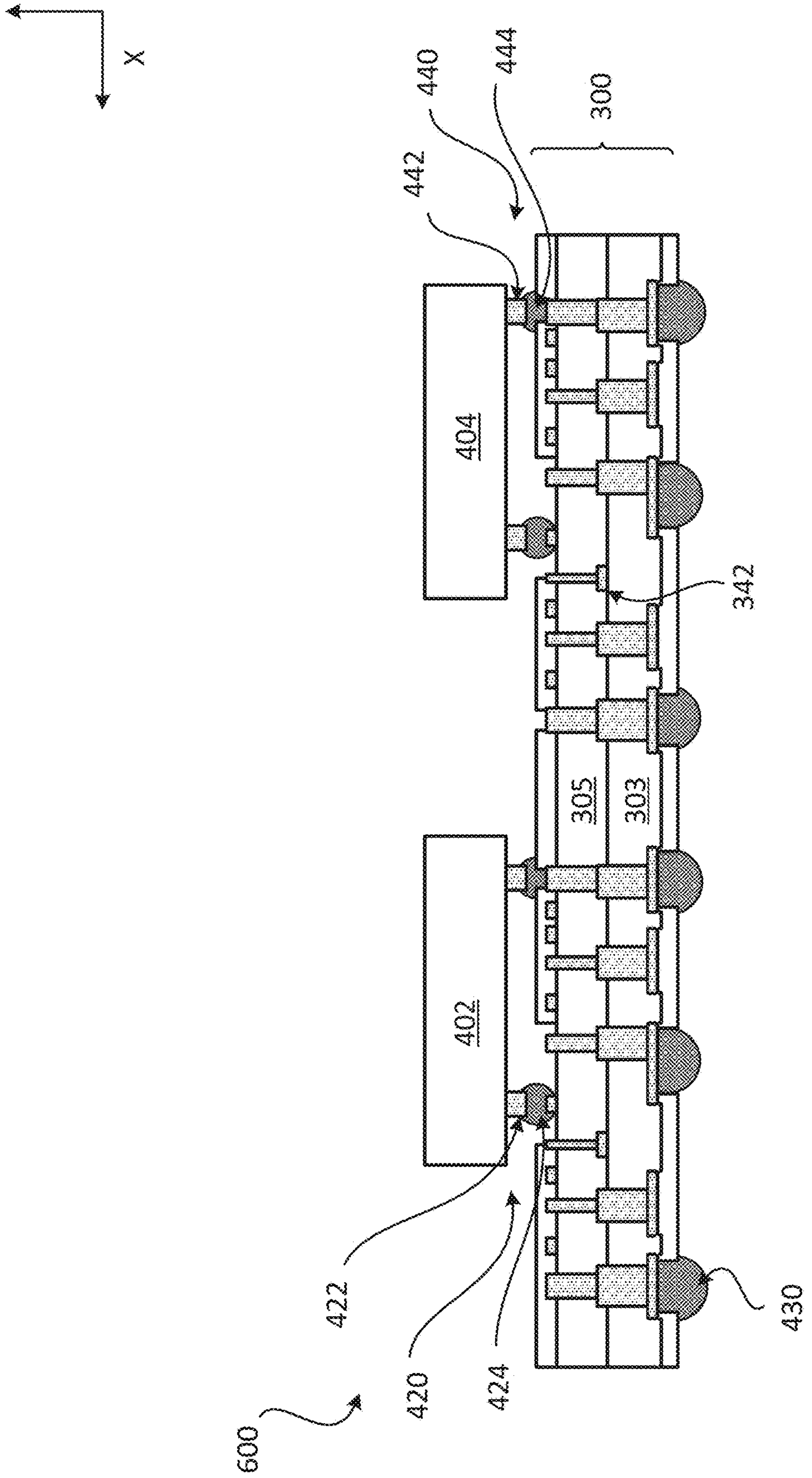
FIG. 6 illustrates an exemplary profile view of a package comprising a substrate with via interconnects with vertical walls.

FIG. 6 illustrates a package 600 that includes the substrate 300, an integrated device 402 and an integrated device 404. The substrate 300 includes a plurality of via interconnects with vertical walls and/or stacked via interconnects, as illustrated and described in at least in FIG. 3.

The integrated device 402 is coupled to the substrate 300 through a plurality of bump interconnects 420. The plurality of bump interconnects 420 may include a plurality of pillar interconnects 422 and/or a plurality of solder interconnects 424. The plurality of pillar interconnects 422 are coupled to the plurality of solder interconnects 424. The plurality of solder interconnects 424 may be coupled to the plurality of interconnects 332 of the substrate 300. In some implementations, the integrated device 402 is coupled to the substrate 300 through the plurality of solder interconnects 424 without the need of the plurality of pillar interconnects 422.

The integrated device 404 is coupled to the substrate 300 through a plurality of bump interconnects 440. The plurality of bump interconnects 440 may include a plurality of pillar interconnects 442 and/or a plurality of solder interconnects 444. The plurality of pillar interconnects 442 are coupled to the plurality of solder interconnects 444. The plurality of solder interconnects 444 may be coupled to the plurality of interconnects 332 of the substrate 300. In some implementations, the integrated device 404 is coupled to the substrate 300 through the plurality of solder interconnects 444 without the need of the plurality of pillar interconnects 442.

An integrated device may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device may include at least one electronic circuit (e.g., first electronic circuit, second electronic circuit, etc . . . ). An integrated device may include transistors. An integrated device may be an example of an electrical component and/or electrical device. In some implementations, an integrated device may include a chiplet. A chiplet may be fabricated using a process that provides better yields compared to other processes that are used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

As mentioned above, in some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). As mentioned above, using several chiplets that perform several functions may reduce the overall cost of a package relative to using a single chip to perform all of the functions of a package. In some implementations, one or more of the chiplets and/or one of more of integrated devices described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, a first integrated device and a second integrated device of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advanced technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Exemplary Sequence for Fabricating a Substrate Comprising Via Interconnects with Vertical Walls FIGS. 7A-7F illustrate an exemplary sequence for providing or fabricating a substrate. In some implementations, the sequence of FIGS. 7A-7F may be used to provide or fabricate any of the substrate described in the disclosure. In some implementations, the sequence of FIGS. 7A-7F may be used to provide or fabricate the substrate 300 described in the disclosure.

It should be noted that the sequence of FIGS. 7A-7F may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate an interconnect block differently.

Figure 7A:
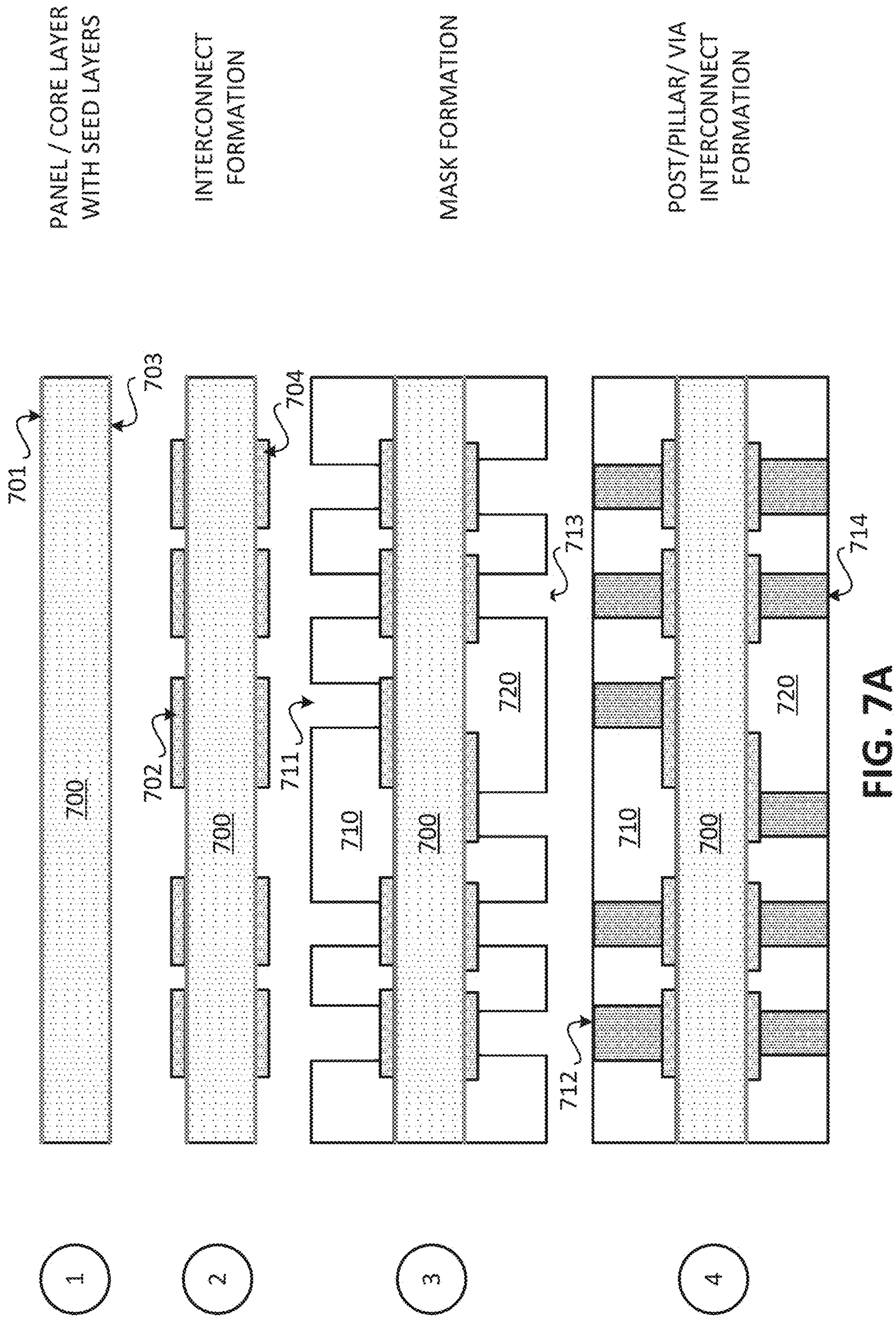
FIGS. 7A-7F illustrate an exemplary sequence for fabricating a substrate with via interconnects with vertical walls.

Stage 1, as shown in FIG. 7A, illustrates a state after a core layer 700 is provided. The core layer 700 may include a seed layer 701 and a seed layer 703. The seed layer 701 and/or the seed layer 703 may include copper. The core layer 700 may be part of a panel.

Stage 2 illustrates a state after a plurality of interconnects 702 are formed and coupled to a first surface of the core layer 700 and/or the seed layer 701. Stage 2 also illustrate a state after a plurality of interconnects 704 are formed and coupled to a second surface of the core layer 700 and/or the seed layer 703. A plating process may be used to form the plurality of interconnects 702 and/or the plurality of interconnects 704.

Stage 3 illustrates a state after a mask layer 710 are formed and coupled to the first surface of the core layer 700 and/or the seed layer 701. The mask layer 710 may include a plurality of openings 711. Stage 3 also illustrates a state after a mask layer 720 are formed and coupled to the second surface of the core layer 700 and/or the seed layer 703. The mask layer 720 may include a plurality of openings 713. A deposition process, an exposure process and/or a development process may be used to form the mask layer 710, the plurality of openings 711, the mask layer 720 and/or the plurality of openings 713.

Stage 4 illustrates a state after a plurality of interconnects 712 are formed in the plurality of openings 711 of the mask layer 710. The plurality of interconnects 712 may be coupled to the plurality of interconnects 702. The plurality of interconnects 712 may include via interconnects. The via interconnects may include vertical walls and/or walls that are approximately vertical. A plating process may be used to form the plurality of interconnects 712.

Stage 4 also illustrates a state after a plurality of interconnects 714 are formed in the plurality of openings 713 of the mask layer 720. The plurality of interconnects 714 may be coupled to the plurality of interconnects 704. The plurality of interconnects 714 may include via interconnects. The via interconnects may include vertical walls and/or walls that are approximately vertical. A plating process may be used to form the plurality of interconnects 714.

Figure 7B:
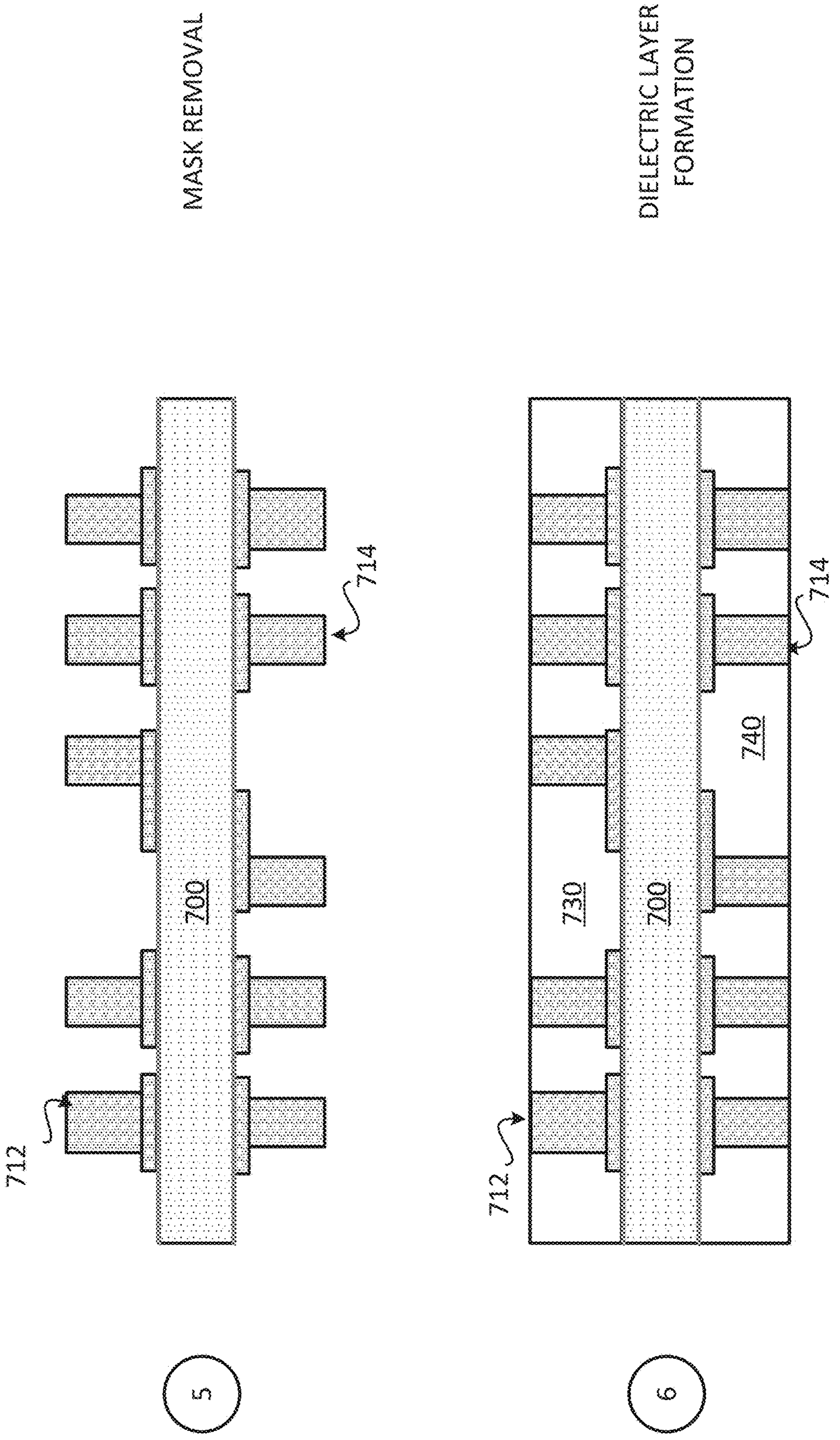

Stage 5, as shown in FIG. 7B, illustrates a state after the mask layer 710 and the mask layer 720 are removed.

Stage 6 illustrates a state after the dielectric layer 730 and the dielectric layer 740 are provided. The dielectric layer 730 may be coupled to the first surface of the core layer 700 and/or the seed layer 701. The dielectric layer 730 may laterally surround the plurality of interconnects 712. The dielectric layer 740 may be coupled to the second surface of the core layer 700 and/or the seed layer 703. The dielectric layer 740 may laterally surround the plurality of interconnects 714. A deposition process and/or a lamination process may be used to provide the dielectric layer 730 and/or the dielectric layer 740.

Figure 7C:
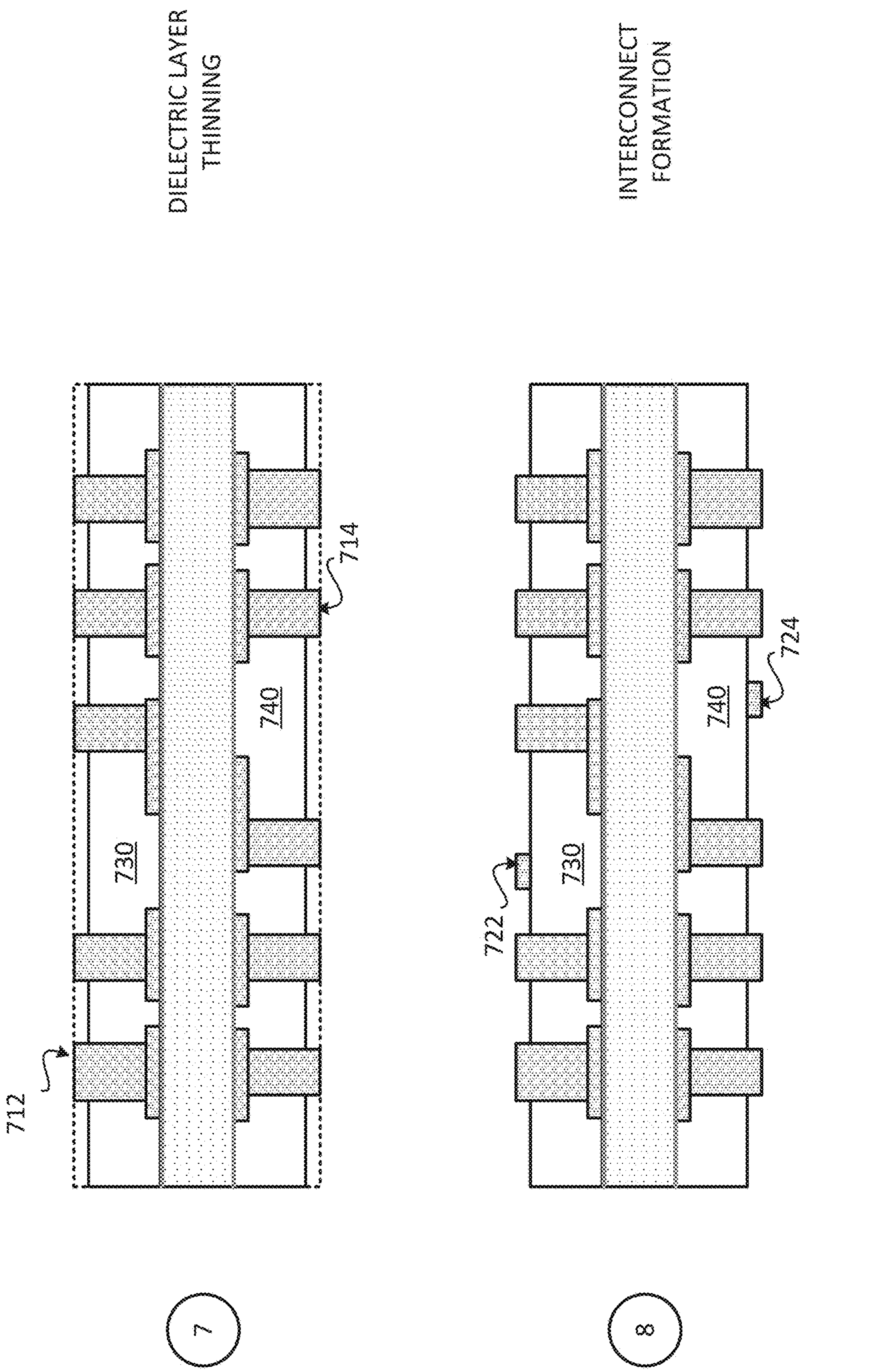

Stage 7, as shown in FIG. 7C, illustrates a state after portions of the dielectric layer 730 are removed, and portions of the dielectric layer 740 are removed. For example, the dielectric layer 730 may be thinned, and the dielectric layer 740 may be thinned. Thinning the dielectric layer 730 may expose portions of the plurality of interconnects 712. Thinning the dielectric layer 740 may expose portions of the plurality of interconnects 714.

Stage 8 illustrates a state after a plurality of interconnects 722 and a plurality of interconnects 724 are formed. The plurality of interconnects 722 may include interconnects that will be part of a metal layer of a substrate. The plurality of interconnects 722 may be located on the thinned surface of the dielectric layer 730. The plurality of interconnects 724 may include interconnects that will be part of a metal layer of a substrate. The plurality of interconnects 724 may be located on the thinned surface of the dielectric layer 740.

Figure 7D:
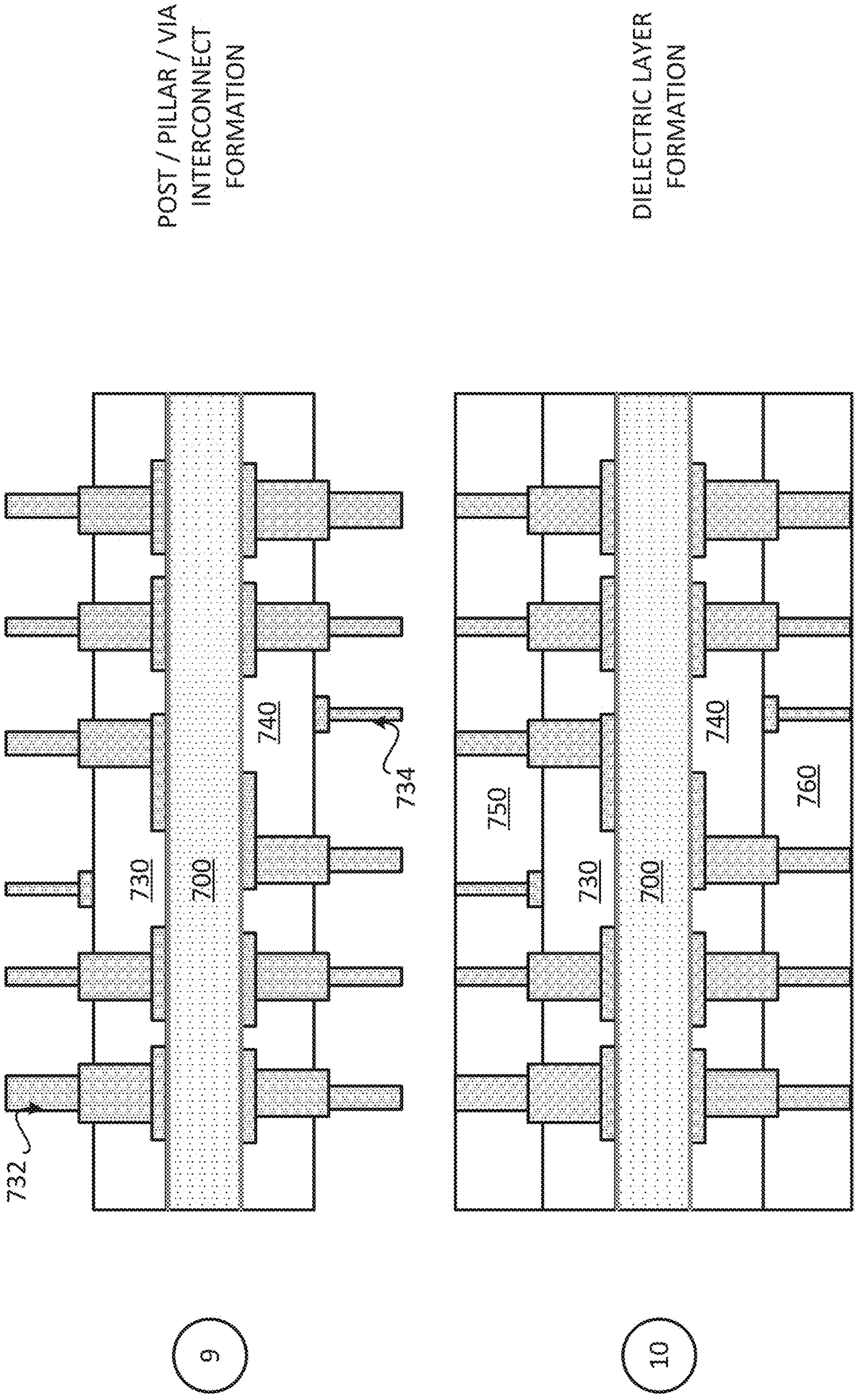

Stage 9, as shown in FIG. 7D, illustrates a state after a plurality of interconnects 732 are formed. The plurality of interconnects 732 may include via interconnects. The plurality of interconnects 732 may be coupled to and touching the plurality of interconnects 722 and the plurality of interconnects 712. In some implementations, a via interconnect from the plurality of interconnects 732 and a via interconnect from the plurality of interconnects 712 may form and/or define a stack of via interconnects without an intervening pad interconnect. The plurality of interconnects 732 may have vertical walls and/or approximately vertical walls. A plating process may be used to form the plurality of interconnects 732. A mask layer may be provided and removed to provide and form the plurality of interconnects 732.

Stage 9 also illustrates a state after a plurality of interconnects 734 are formed. The plurality of interconnects 734 may include via interconnects. The plurality of interconnects 734 may be coupled to and touching the plurality of interconnects 724 and the plurality of interconnects 714. In some implementations, a via interconnect from the plurality of interconnects 734 and a via interconnect from the plurality of interconnects 714 may form and/or define a stack of via interconnects without an intervening pad interconnect. The plurality of interconnects 734 may have vertical walls and/or approximately vertical walls. A plating process may be used to form the plurality of interconnects 734. A mask layer may be provided and removed to provide and form the plurality of interconnects 734.

Stage 10 illustrates a state after the dielectric layer 750 and the dielectric layer 760 are provided. The dielectric layer 750 may be coupled to the first surface of the dielectric layer 730. The dielectric layer 750 may laterally surround the plurality of interconnects 732. The dielectric layer 760 may be coupled to the dielectric layer 740. The dielectric layer 760 may laterally surround the plurality of interconnects 734. A deposition process and/or a lamination process may be used to provide the dielectric layer 750 and/or the dielectric layer 760.

Figure 7E:
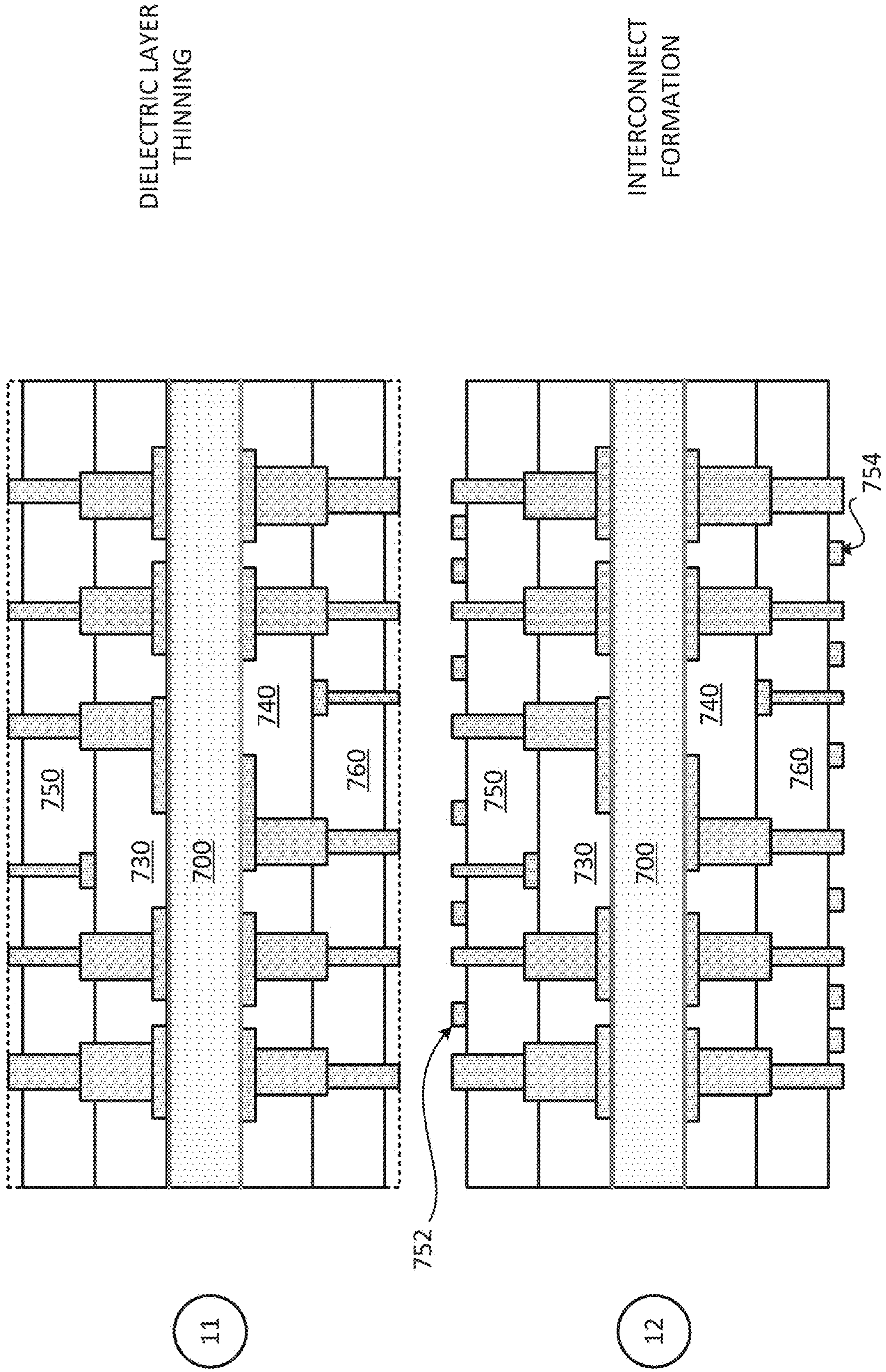

Stage 11, as shown in FIG. 7E, illustrates a state after portions of the dielectric layer 750 are removed, and portions of the dielectric layer 760 are removed. For example, the dielectric layer 750 may be thinned, and the dielectric layer 760 may be thinned. Thinning the dielectric layer 750 may expose portions of the plurality of interconnects 732. Thinning the dielectric layer 760 may expose portions of the plurality of interconnects 734.

Stage 12 illustrates a state after a plurality of interconnects 752 and a plurality of interconnects 754 are formed. The plurality of interconnects 752 may include interconnects that will be part of a metal layer of a substrate. The plurality of interconnects 752 may be located on the thinned surface of the dielectric layer 750. The plurality of interconnects 754 may include interconnects that will be part of a metal layer of a substrate. The plurality of interconnects 754 may be located on the thinned surface of the dielectric layer 760.

Figure 7F:
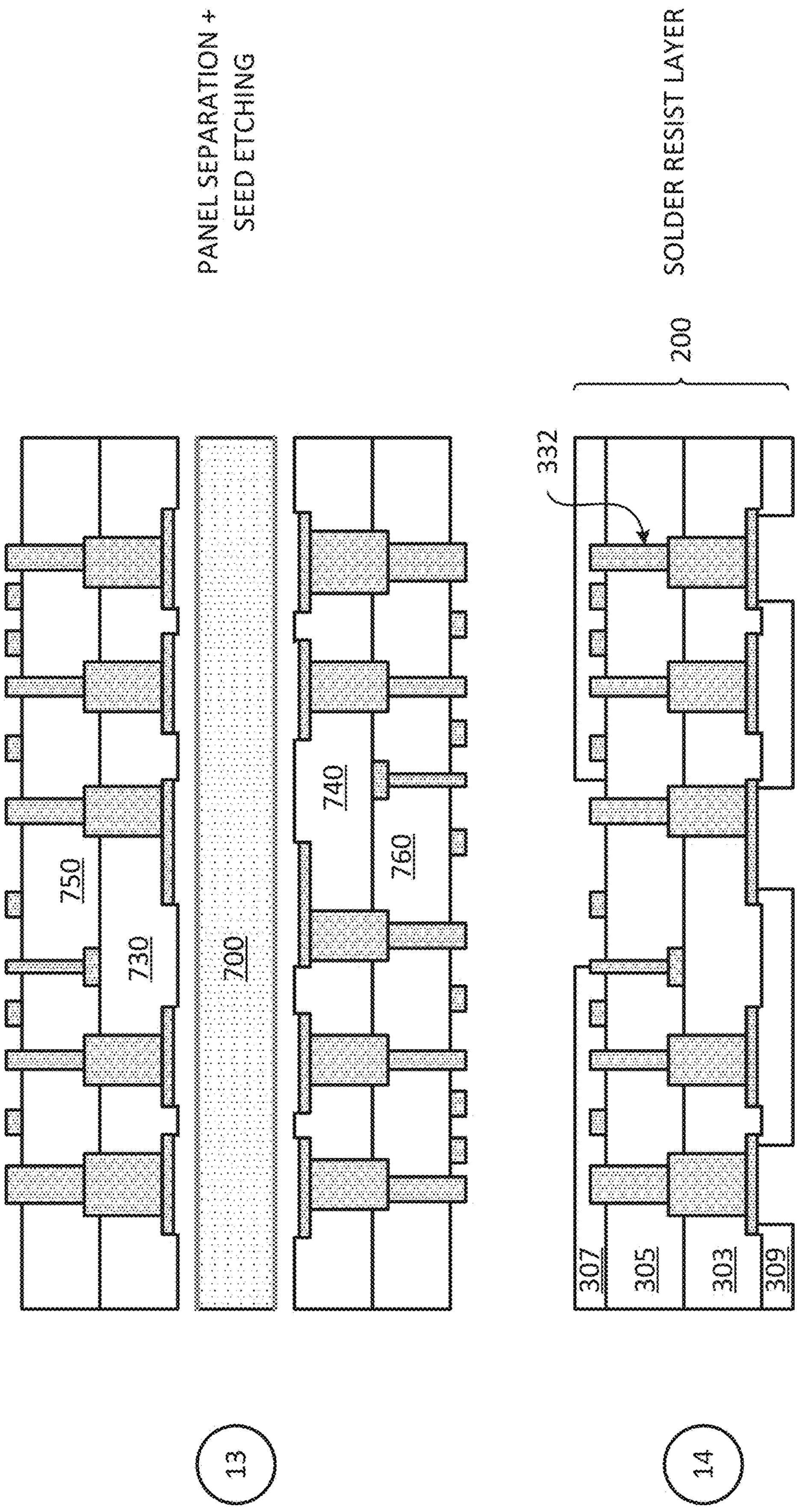

Stage 13, as shown in FIG. 7F, illustrates a state after panel separation and/or wafer separation, where dielectric layers (e.g., 730 and 750, 740, 760) and interconnects (e.g., 702, 712, 722, 732, 752) are separated from the core layer 700. Portions of the seed layers coupled to interconnects may also be removed and/or etched.

Stage 14 illustrates a state after solder resist layers are coupled to the dielectric layer. For example, a solder resist layer 307 is coupled to the dielectric layer 305 and a solder resist layer 309 is coupled to the dielectric layer 303.

In some implementations, the dielectric layer 303 may represent the dielectric layer 730, and the dielectric layer 305 may represent the dielectric layer 750. In some implementations, the plurality of interconnects 332 may represent the plurality of interconnects 702, the plurality of interconnects 712, the plurality of interconnects 722, the plurality of interconnects 732, and/or the plurality of interconnects 752.

In some implementations, the dielectric layer 303 may represent the dielectric layer 740, and the dielectric layer 305 may represent the dielectric layer 760. In some implementations, the plurality of interconnects 332 may represent the plurality of interconnects 704, the plurality of interconnects 714, the plurality of interconnects 724, the plurality of interconnects 734, and/or the plurality of interconnects 754.

Stage 14 may illustrate the substrate 300, as described in FIG. 3. As mentioned above, the process of FIGS. 7A-7F may be used to fabricate the substrate 200.

Figure 8:
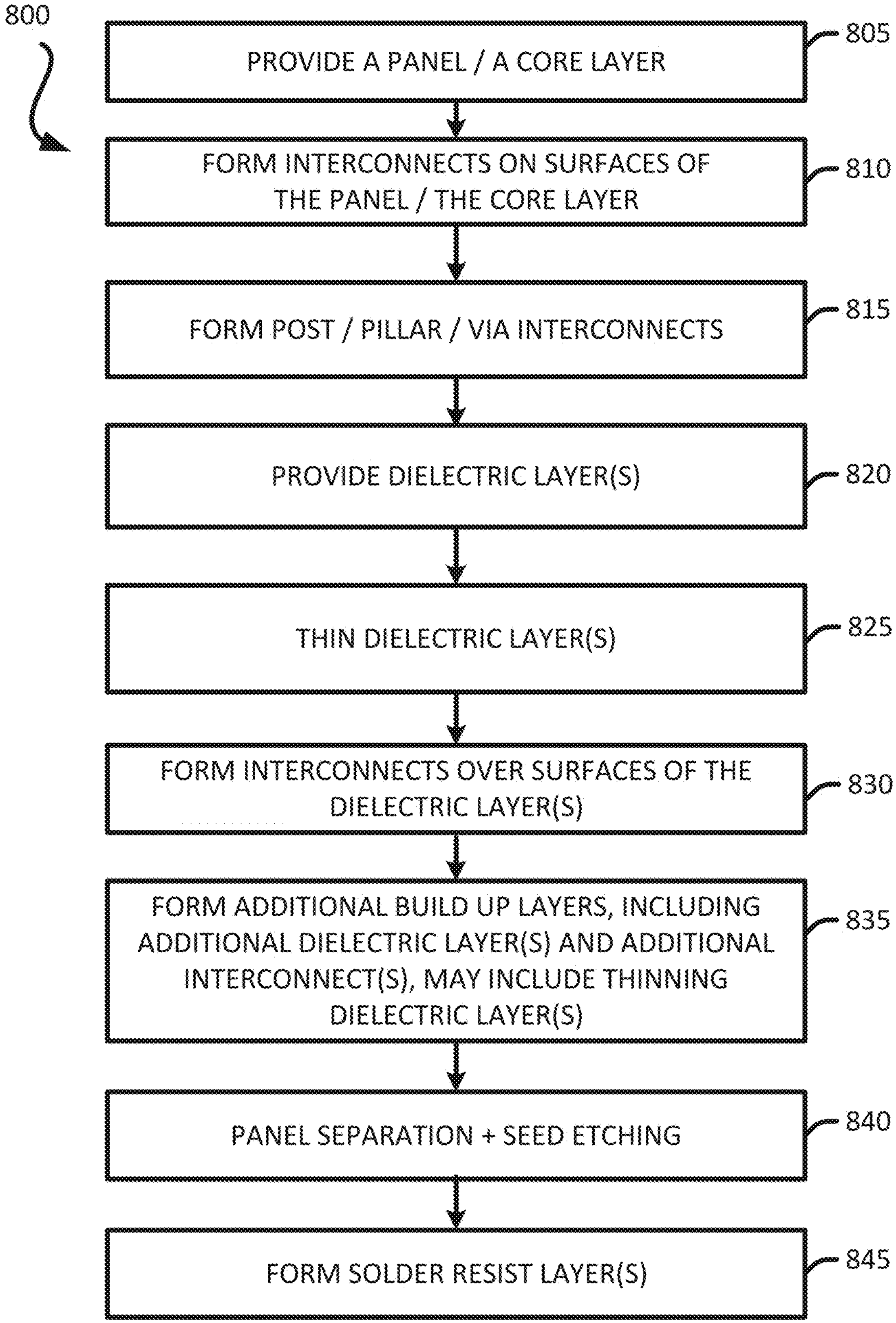
FIG. 8 illustrates an exemplary sequence for fabricating a substrate with via interconnects with vertical walls.

Exemplary Flow Diagram of a Method for Fabricating a Substrate with Via Interconnect with a Vertical Wall In some implementations, fabricating a substrate includes several processes. FIG. 8 illustrates an exemplary flow diagram of a method 800 for providing or fabricating a substrate. In some implementations, the method 800 of FIG. 8 may be used to provide or fabricate the substrate 300.

It should be noted that the method 800 of FIG. 8 may combine one or more processes in order to simplify and/or clarify the method for providing or fabricating a substrate. In some implementations, the order of the processes may be changed or modified.

The method provides (at 805) a core layer with seed layers. Stage 1 of FIG. 7A, illustrates and describes an example of a state after a core layer 700 is provided. The core layer 700 may include a seed layer 701 and a seed layer 703. The seed layer 701 and/or the seed layer 703 may include copper. The core layer 700 may be part of a panel.

The method forms (at 810) a plurality of interconnects on surface of the core layer. Stage 2 of FIG. 7A, illustrates and describes an example of a state after a plurality of interconnects 702 are formed and coupled to a first surface of the core layer 700 and/or the seed layer 701. Stage 2 also illustrate a state after a plurality of interconnects 704 are formed and coupled to a second surface of the core layer 700 and/or the seed layer 703. A plating process may be used to form the plurality of interconnects 702 and/or the plurality of interconnects 704.

The method forms (815) a plurality of via interconnects. Forming the plurality of via interconnects may include forming a mask layer and removing a mask layer. Stage 3 of FIG. 7A, illustrates and describes an example of a state after a mask layer 710 are formed and coupled to the first surface of the core layer 700 and/or the seed layer 701. The mask layer 710 may include a plurality of openings 711. Stage 3 of FIG. 7A also illustrates a state after a mask layer 720 are formed and coupled to the second surface of the core layer 700 and/or the seed layer 703. The mask layer 720 may include a plurality of openings 713. A deposition process, an exposure process and/or a development process may be used to form the mask layer 710, the plurality of openings 711, the mask layer 720 and/or the plurality of openings 713.

Stage 4 of FIG. 7A, illustrates and describes an example of a state after a plurality of interconnects 712 are formed in the plurality of openings 711 of the mask layer 710. The plurality of interconnects 712 may be coupled to the plurality of interconnects 702. The plurality of interconnects 712 may include via interconnects. The via interconnects may include vertical walls and/or walls that are approximately vertical. A plating process may be used to form the plurality of interconnects 712.

Stage 4 of FIG. 7A, also illustrates and describes an example of a state after a plurality of interconnects 714 are formed in the plurality of openings 713 of the mask layer 720. The plurality of interconnects 714 may be coupled to the plurality of interconnects 704. The plurality of interconnects 714 may include via interconnects. The via interconnects may include vertical walls and/or walls that are approximately vertical. A plating process may be used to form the plurality of interconnects 714.

Stage 5 FIG. 7B, illustrates and describes an example of a state after the mask layer 710 and the mask layer 720 are removed.

The method forms (at 820) at least one dielectric layer. Stage 6 of FIG. 7B, illustrates and describes an example of a state after the dielectric layer 730 and the dielectric layer 740 are provided. The dielectric layer 730 may be coupled to the first surface of the core layer 700 and/or the seed layer 701. The dielectric layer 730 may laterally surround the plurality of interconnects 712. The dielectric layer 740 may be coupled to the second surface of the core layer 700 and/or the seed layer 703. The dielectric layer 740 may laterally surround the plurality of interconnects 714. A deposition process and/or a lamination process may be used to provide the dielectric layer 730 and/or the dielectric layer 740.

The method removes (at 825) portions of at least one dielectric layer. Stage 7 of FIG. 7C, illustrates and describes an example of a state after portions of the dielectric layer 730 are removed, and portions of the dielectric layer 740 are removed. For example, the dielectric layer 730 may be thinned, and the dielectric layer 740 may be thinned. Thinning the dielectric layer 730 may expose portions of the plurality of interconnects 712. Thinning the dielectric layer 740 may expose portions of the plurality of interconnects 714.

The method forms (at 830) on thinned surfaces of the dielectric layer(s). Stage 8 of FIG. 7C, illustrates and describes an example of a state after a plurality of interconnects 722 and a plurality of interconnects 724 are formed. The plurality of interconnects 722 may include interconnects that will be part of a metal layer of a substrate. The plurality of interconnects 722 may be located on the thinned surface of the dielectric layer 730. The plurality of interconnects 724 may include interconnects that will be part of a metal layer of a substrate. The plurality of interconnects 724 may be located on the thinned surface of the dielectric layer 740.

The method may form (at 835) additional dielectric layers and additional interconnects, which may include thinning one or more dielectric layers. Stage 9 of FIG. 7E, illustrates and describes an example of a state after a plurality of interconnects 732 are formed. The plurality of interconnects 732 may include via interconnects. The plurality of interconnects 732 may be coupled to and touching the plurality of interconnects 722 and the plurality of interconnects 712. In some implementations, a via interconnect from the plurality of interconnects 732 and a via interconnect from the plurality of interconnects 712 may form and/or define a stack of via interconnects without an intervening pad interconnect. The plurality of interconnects 732 may have vertical walls and/or approximately vertical walls. A plating process may be used to form the plurality of interconnects 732. A mask layer may be provided and removed to provide and form the plurality of interconnects 732.

Stage 9 of FIG. 7D illustrates a state after a plurality of interconnects 734 are formed. The plurality of interconnects 734 may include via interconnects. The plurality of interconnects 734 may be coupled to and touching the plurality of interconnects 724 and the plurality of interconnects 714. In some implementations, a via interconnect from the plurality of interconnects 734 and a via interconnect from the plurality of interconnects 714 may form and/or define a stack of via interconnects without an intervening pad interconnect. The plurality of interconnects 734 may have vertical walls and/or approximately vertical walls. A plating process may be used to form the plurality of interconnects 734. A mask layer may be provided and removed to provide and form the plurality of interconnects 734.

Stage 10 of FIG. 7D, illustrates and describes an example of a state after the dielectric layer 750 and the dielectric layer 760 are provided. The dielectric layer 750 may be coupled to the first surface of the dielectric layer 730. The dielectric layer 750 may laterally surround the plurality of interconnects 732. The dielectric layer 760 may be coupled to the dielectric layer 740. The dielectric layer 760 may laterally surround the plurality of interconnects 734. A deposition process and/or a lamination process may be used to provide the dielectric layer 750 and/or the dielectric layer 760.

Stage 11 of FIG. 7E, illustrates and describes an example of a state after portions of the dielectric layer 750 are removed, and portions of the dielectric layer 760 are removed. For example, the dielectric layer 750 may be thinned, and the dielectric layer 760 may be thinned. Thinning the dielectric layer 750 may expose portions of the plurality of interconnects 732. Thinning the dielectric layer 760 may expose portions of the plurality of interconnects 734.

Stage 12 of FIG. 7E, illustrates and describes an example of a state after a plurality of interconnects 752 and a plurality of interconnects 754 are formed. The plurality of interconnects 752 may include interconnects that will be part of a metal layer of a substrate. The plurality of interconnects 752 may be located on the thinned surface of the dielectric layer 750. The plurality of interconnects 754 may include interconnects that will be part of a metal layer of a substrate. The plurality of interconnects 754 may be located on the thinned surface of the dielectric layer 760.

The method performs (at 840) panel separation. Stage 13 of FIG. 7F, illustrates and describes an example of a state after panel separation and/or wafer separation, where dielectric layers (e.g., 730 and 750, 740, 760) and interconnects (e.g., 702, 712, 722, 732, 752) are separated from the core layer 700. Portions of the seed layers coupled to interconnects may also be removed and/or etched.

The method forms (at 845) solder resist layers on the dielectric layers. Stage 14 of FIG. 7F, illustrates and describes an example of a state after solder resist layers are coupled to the dielectric layer. For example, a solder resist layer 307 is coupled to the dielectric layer 305 and a solder resist layer 309 is coupled to the dielectric layer 303.

In some implementations, the dielectric layer 303 may represent the dielectric layer 730, and the dielectric layer 305 may represent the dielectric layer 750. In some implementations, the plurality of interconnects 332 may represent the plurality of interconnects 702, the plurality of interconnects 712, the plurality of interconnects 722, the plurality of interconnects 732, and/or the plurality of interconnects 752.

In some implementations, the dielectric layer 303 may represent the dielectric layer 740, and the dielectric layer 305 may represent the dielectric layer 760. In some implementations, the plurality of interconnects 332 may represent the plurality of interconnects 704, the plurality of interconnects 714, the plurality of interconnects 724, the plurality of interconnects 734, and/or the plurality of interconnects 754.

Stage 14 of FIG. 7F, may illustrate the substrate 300, as described in FIG. 3. As mentioned above, the process of FIGS. 7A-7F may be used to fabricate the substrate 200.

Exemplary Sequence for Fabricating a Substrate Comprising Via Interconnects with Vertical Walls FIGS. 9A-9E illustrate an exemplary sequence for providing or fabricating a substrate. In some implementations, the sequence of FIGS. 9A-9E may be used to provide or fabricate any of the substrate described in the disclosure. In some implementations, the sequence of FIGS. 9A-9E may be used to provide or fabricate the substrate 100 described in the disclosure.

It should be noted that the sequence of FIGS. 9A-9E may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate an interconnect block differently.

Figure 9A:
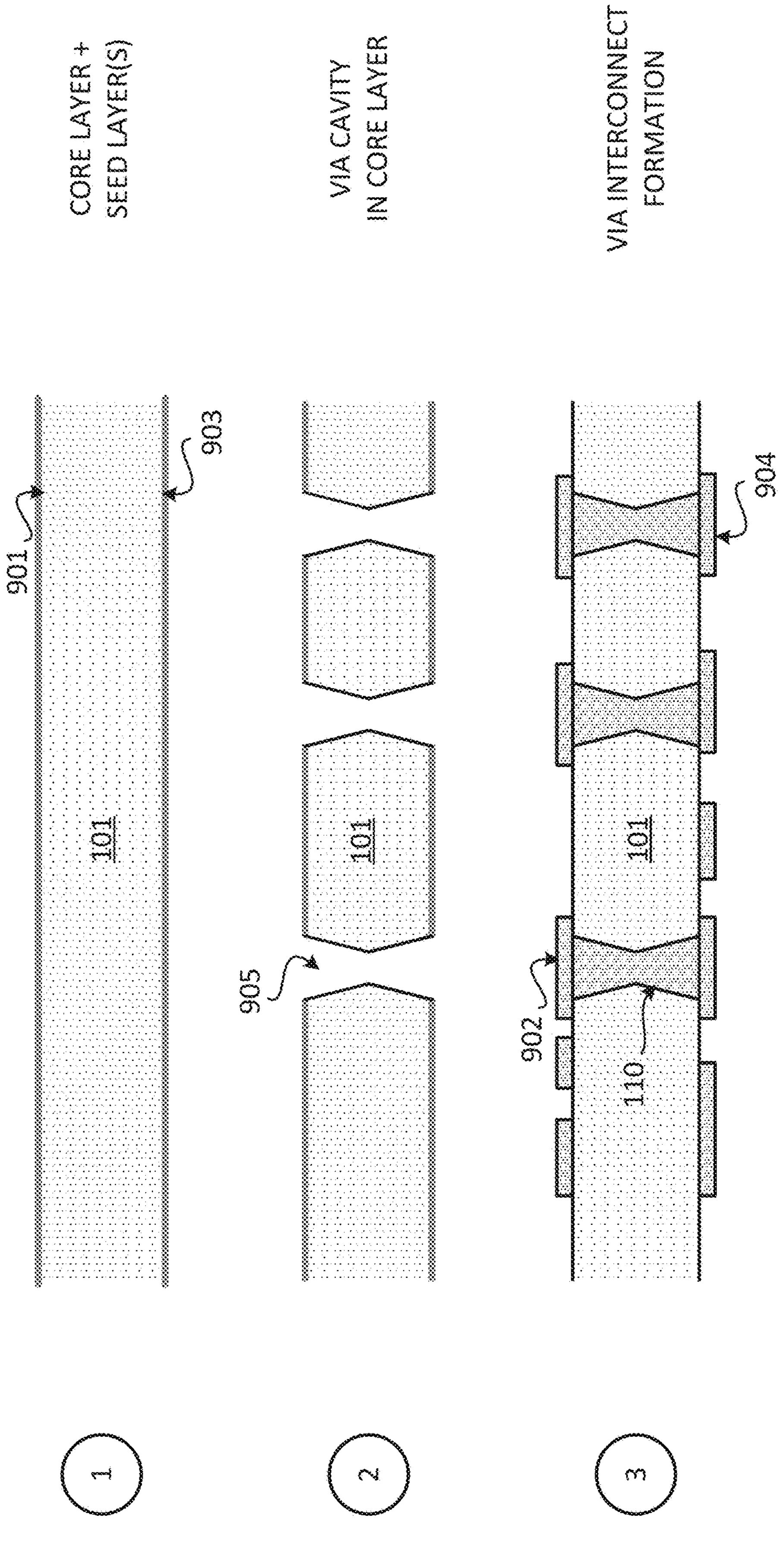
FIGS. 9A-9E illustrate an exemplary sequence for fabricating a substrate with via interconnects with vertical walls.

Stage 1, as shown in FIG. 9A, illustrates a state after a core layer 101 is provided. The core layer 101 may include a seed layer 901 and a seed layer 903. The seed layer 901 and/or the seed layer 903 may include copper. The core layer 101 may be part of a panel.

Stage 2 illustrates a state after a plurality of via cavities 905 are formed through the core layer 101, the seed layer 901 and the seed layer 903. A laser ablation process may be used to form the plurality of via cavities 905.

Stage 3 illustrates a state after a plurality of via interconnects 110 are formed in the plurality of via cavities 905. Stage 3 also illustrates a state after a plurality of interconnects 902 are formed and coupled to a first surface of the core layer 101 and/or the seed layer 901. Stage 3 also illustrate a state after a plurality of interconnects 904 are formed and coupled to a second surface of the core layer 101 and/or the seed layer 903. A plating process may be used to form the plurality of via interconnects 110, the plurality of interconnects 902 and/or the plurality of interconnects 904. The plurality of via interconnects 110 may be coupled to and touching the plurality of interconnects 902 and/or the plurality of interconnects 904.

Figure 9B:
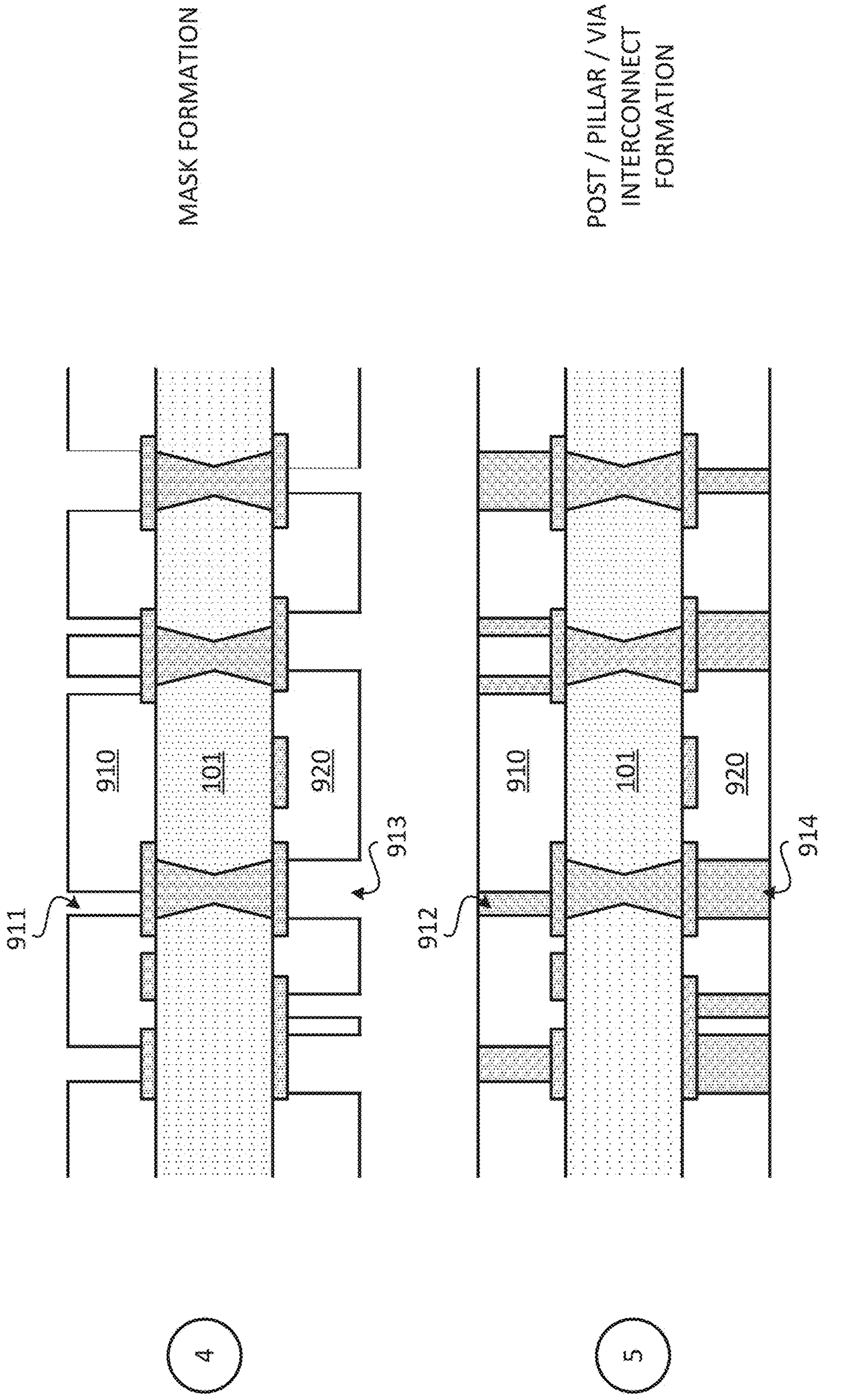

Stage 4, as shown in FIG. 9B, illustrates a state after a mask layer 910 are formed and coupled to the first surface of the core layer 101 and/or the seed layer 901. The mask layer 910 may include a plurality of openings 911. Stage 4 also illustrates a state after a mask layer 920 are formed and coupled to the second surface of the core layer 101 and/or the seed layer 903. The mask layer 920 may include a plurality of openings 913. A deposition process, an exposure process and/or a development process may be used to form the mask layer 910, the plurality of openings 911, the mask layer 920 and/or the plurality of openings 913.

Stage 5 illustrates a state after a plurality of interconnects 912 are formed in the plurality of openings 911 of the mask layer 910. The plurality of interconnects 912 may be coupled to the plurality of interconnects 902. The plurality of interconnects 912 may include via interconnects. The via interconnects may include vertical walls and/or walls that are approximately vertical. A plating process may be used to form the plurality of interconnects 912.

Stage 5 also illustrates a state after a plurality of interconnects 914 are formed in the plurality of openings 913 of the mask layer 920. The plurality of interconnects 914 may be coupled to the plurality of interconnects 904. The plurality of interconnects 914 may include via interconnects. The via interconnects may include vertical walls and/or walls that are approximately vertical. A plating process may be used to form the plurality of interconnects 914.

Figure 9C:
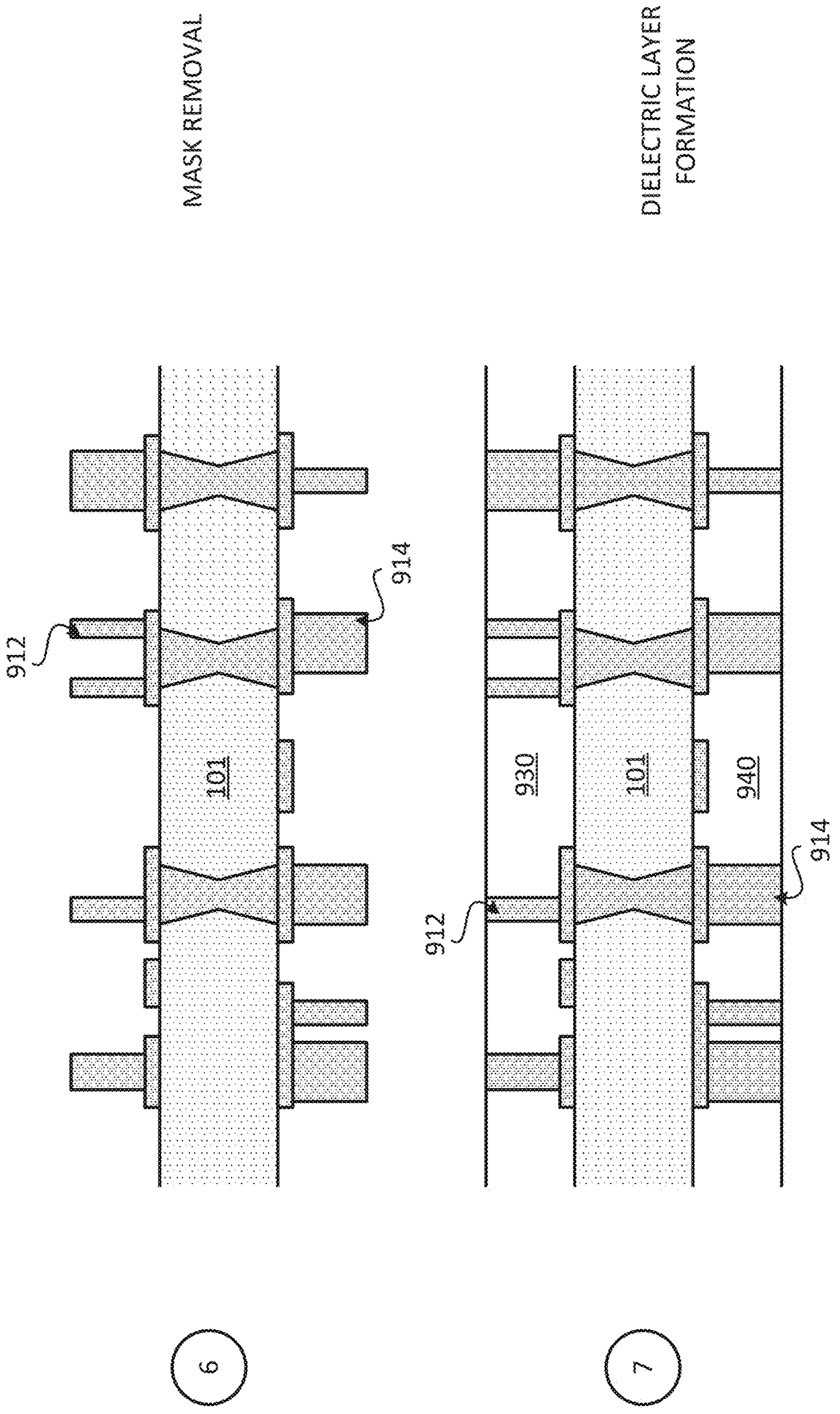

Stage 6, as shown in FIG. 9C, illustrates a state after the mask layer 910 and the mask layer 920 are removed.

Stage 7 illustrates a state after the dielectric layer 930 and the dielectric layer 940 are provided. The dielectric layer 930 may be coupled to the first surface of the core layer 900 and/or the seed layer 901. The dielectric layer 930 may laterally surround the plurality of interconnects 912. The dielectric layer 940 may be coupled to the second surface of the core layer 900 and/or the seed layer 903. The dielectric layer 940 may laterally surround the plurality of interconnects 914. A deposition process and/or a lamination process may be used to provide the dielectric layer 930 and/or the dielectric layer 940.

Figure 9D:
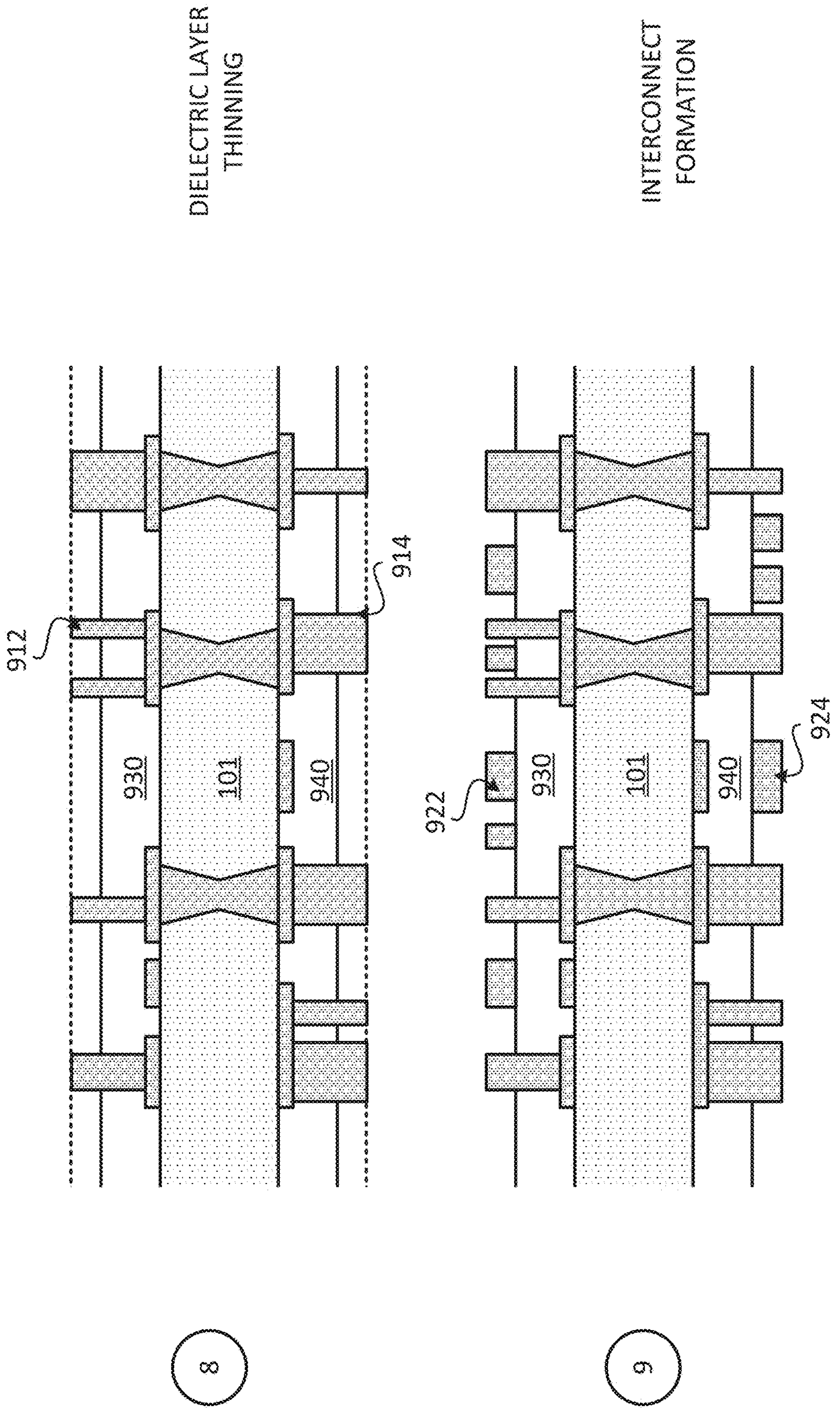

Stage 8, as shown in FIG. 9D, illustrates a state after portions of the dielectric layer 930 are removed, and portions of the dielectric layer 940 are removed. For example, the dielectric layer 930 may be thinned, and the dielectric layer 940 may be thinned. Thinning the dielectric layer 930 may expose portions of the plurality of interconnects 912. Thinning the dielectric layer 940 may expose portions of the plurality of interconnects 914.

Stage 9 illustrates a state after a plurality of interconnects 922 and a plurality of interconnects 924 are formed. The plurality of interconnects 922 may include interconnects that will be part of a metal layer of a substrate. The plurality of interconnects 922 may be located on the thinned surface of the dielectric layer 930. The plurality of interconnects 924 may include interconnects that will be part of a metal layer of a substrate. The plurality of interconnects 924 may be located on the thinned surface of the dielectric layer 940.

Figure 9E:
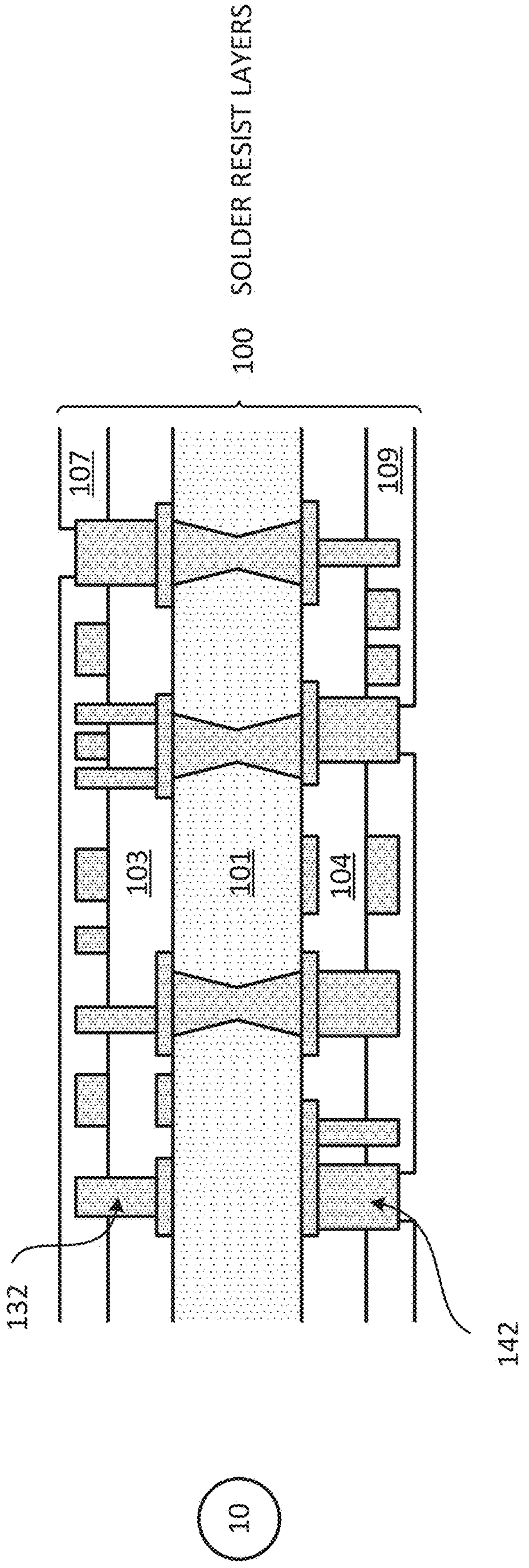

Stage 10, as shown in FIG. 9E, illustrates a state after solder resist layers are coupled to the dielectric layer. For example, a solder resist layer 107 is coupled to the dielectric layer 103 and a solder resist layer 109 is coupled to the dielectric layer 104.

In some implementations, the dielectric layer 103 may represent the dielectric layer 930, and the dielectric layer 104 may represent the dielectric layer 950. In some implementations, the plurality of interconnects 132 may represent the plurality of interconnects 902, the plurality of interconnects 912, and/or the plurality of interconnects 922. In some implementations, the plurality of interconnects 142 may represent the plurality of interconnects 904, the plurality of interconnects 914, and/or the plurality of interconnects 924. Stage 14 may illustrate the substrate 100, as described in FIG. 1.

Figure 10:
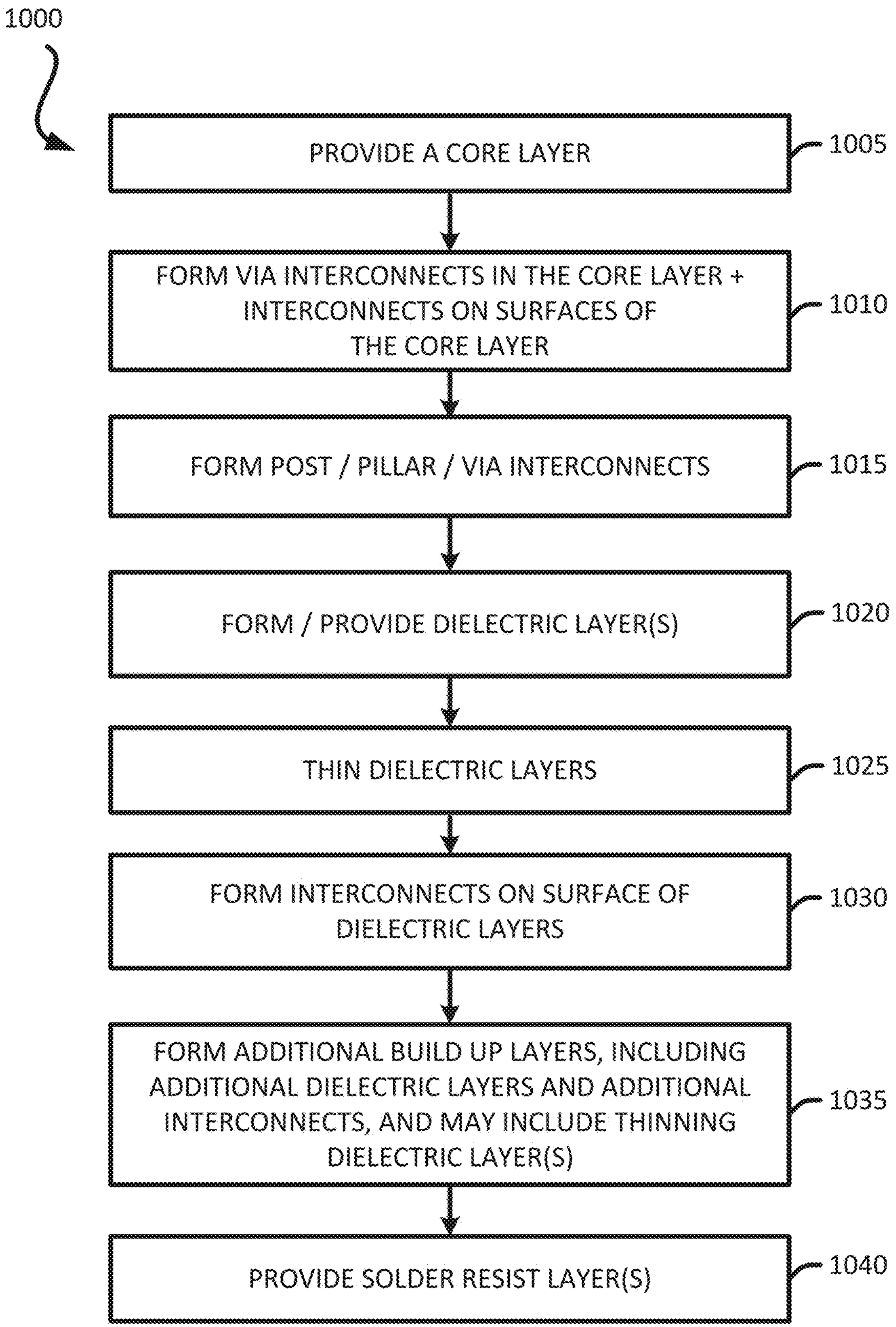
FIG. 10 illustrates an exemplary sequence for fabricating a substrate with via interconnects with vertical walls.

Exemplary Flow Diagram of a Method for Fabricating a Substrate with Via Interconnect with a Vertical Wall In some implementations, fabricating a substrate includes several processes. FIG. 10 illustrates an exemplary flow diagram of a method 1000 for providing or fabricating a substrate. In some implementations, the method 1000 of FIG. 8 may be used to provide or fabricate the substrate 100.

It should be noted that the method 1000 of FIG. 10 may combine one or more processes in order to simplify and/or clarify the method for providing or fabricating a substrate. In some implementations, the order of the processes may be changed or modified.

The method provides (at 1005) a core layer with seed layers. Stage 1 of FIG. 9A, illustrates and describes an example of a state after a core layer 101 is provided. The core layer 101 may include a seed layer 901 and a seed layer 903. The seed layer 901 and/or the seed layer 903 may include copper. The core layer 101 may be part of a panel.

The method forms (at 1010) via interconnects in the core layer and interconnects on surface of the core layer. Forming via interconnects includes forming via cavities in the core layer. Stage 2 of FIG. 9A, illustrates and describes an example of a state after a plurality of via cavities 905 are formed through the core layer 101, the seed layer 901 and the seed layer 903. A laser ablation process may be used to form the plurality of via cavities 905.

Stage 3 of FIG. 9A, illustrates and describes an example of a state after a plurality of via interconnects 110 are formed in the plurality of via cavities 905. Stage 3 also illustrates a state after a plurality of interconnects 902 are formed and coupled to a first surface of the core layer 101 and/or the seed layer 901. Stage 3 also illustrate a state after a plurality of interconnects 904 are formed and coupled to a second surface of the core layer 101 and/or the seed layer 903. A plating process may be used to form the plurality of via interconnects 110, the plurality of interconnects 902 and/or the plurality of interconnects 904. The plurality of via interconnects 110 may be coupled to and touching the plurality of interconnects 902 and/or the plurality of interconnects 904.

The method forms (at 1015) interconnects (e.g., via interconnects). Forming interconnects may include forming and removing a mask layer. Stage 4 FIG. 9B, illustrates and describes an example of a state after a mask layer 910 are formed and coupled to the first surface of the core layer 101 and/or the seed layer 901. The mask layer 910 may include a plurality of openings 911. Stage 4 also illustrates a state after a mask layer 920 are formed and coupled to the second surface of the core layer 101 and/or the seed layer 903. The mask layer 920 may include a plurality of openings 913. A deposition process, an exposure process and/or a development process may be used to form the mask layer 910, the plurality of openings 911, the mask layer 920 and/or the plurality of openings 913.

Stage 5 of FIG. 9B, illustrates and describes an example of a state after a plurality of interconnects 912 are formed in the plurality of openings 911 of the mask layer 910. The plurality of interconnects 912 may be coupled to the plurality of interconnects 902. The plurality of interconnects 912 may include via interconnects. The via interconnects may include vertical walls and/or walls that are approximately vertical. A plating process may be used to form the plurality of interconnects 912.

Stage 5 of FIG. 9B, also illustrates and describes an example of a state after a plurality of interconnects 914 are formed in the plurality of openings 913 of the mask layer 920. The plurality of interconnects 914 may be coupled to the plurality of interconnects 904. The plurality of interconnects 914 may include via interconnects. The via interconnects may include vertical walls and/or walls that are approximately vertical. A plating process may be used to form the plurality of interconnects 914.

Stage 6 of FIG. 9C, illustrates and describes an example of a state after the mask layer 910 and the mask layer 920 are removed.

The method provides (at 1020) at least one dielectric layer. Stage 7 of FIG. 9C, illustrates and describes an example of a state after the dielectric layer 930 and the dielectric layer 940 are provided. The dielectric layer 930 may be coupled to the first surface of the core layer 900 and/or the seed layer 901. The dielectric layer 930 may laterally surround the plurality of interconnects 912. The dielectric layer 940 may be coupled to the second surface of the core layer 900 and/or the seed layer 903. The dielectric layer 940 may laterally surround the plurality of interconnects 914. A deposition process and/or a lamination process may be used to provide the dielectric layer 930 and/or the dielectric layer 940.

The method removes (at 1025) portions of the dielectric layer. Stage 8 of FIG. 9D, illustrates and describes an example of a state after portions of the dielectric layer 930 are removed, and portions of the dielectric layer 940 are removed. For example, the dielectric layer 930 may be thinned, and the dielectric layer 940 may be thinned. Thinning the dielectric layer 930 may expose portions of the plurality of interconnects 912. Thinning the dielectric layer 940 may expose portions of the plurality of interconnects 914.

The method forms (at 1030) interconnects on surfaces of the dielectric layer. Stage 9 of FIG. 9D, illustrates and describes an example of a state after a plurality of interconnects 922 and a plurality of interconnects 924 are formed. The plurality of interconnects 922 may include interconnects that will be part of a metal layer of a substrate. The plurality of interconnects 922 may be located on the thinned surface of the dielectric layer 930. The plurality of interconnects 924 may include interconnects that will be part of a metal layer of a substrate. The plurality of interconnects 924 may be located on the thinned surface of the dielectric layer 940.

The method forms (at 1035) additional build up layers, including forming interconnects, forming a dielectric layers, thinning dielectric layers and forming interconnects. The process may be iteratively repeated to form as many metal layers as needed.

The method forms (at 840) solder resist layers. Stage 10 of FIG. 9E, illustrates and describes an example of a state after solder resist layers are coupled to the dielectric layer. For example, a solder resist layer 107 is coupled to the dielectric layer 103 and a solder resist layer 109 is coupled to the dielectric layer 104.

In some implementations, the dielectric layer 103 may represent the dielectric layer 930, and the dielectric layer 104 may represent the dielectric layer 950. In some implementations, the plurality of interconnects 132 may represent the plurality of interconnects 902, the plurality of interconnects 912, and/or the plurality of interconnects 922. In some implementations, the plurality of interconnects 142 may represent the plurality of interconnects 904, the plurality of interconnects 914, and/or the plurality of interconnects 924. Stage 14 may illustrate the substrate 100, as described in FIG. 1.

Exemplary Electronic Devices

Figure 11:
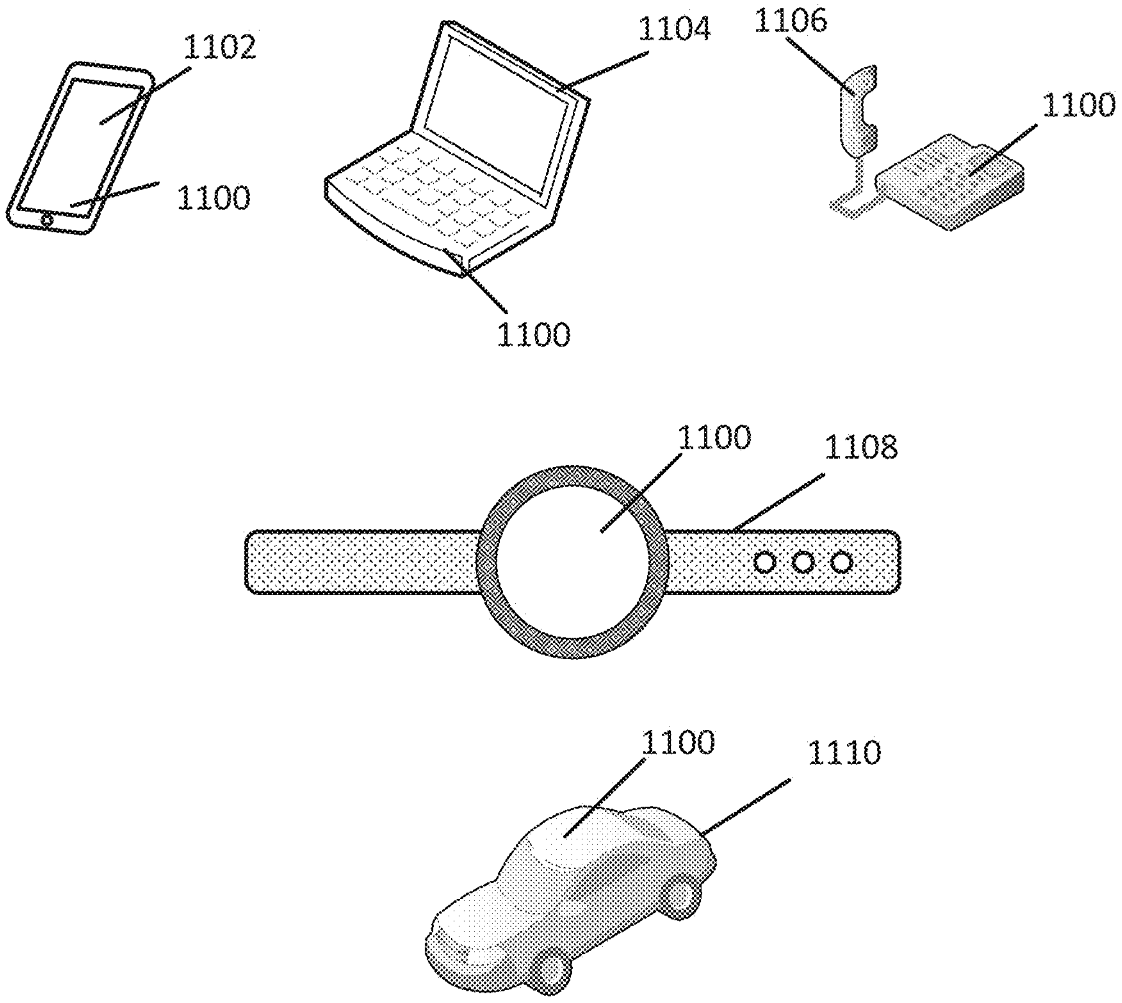
FIG. 11 illustrates various electronic devices that may integrate a die, an electronic circuit, an integrated device, an integrated passive device (IPD), a passive component, a package, and/or a device package described herein.

FIG. 11 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1102, a laptop computer device 1104, a fixed location terminal device 1106, a wearable device 1108, or automotive vehicle 1110 may include a device 1100 as described herein. The device 1100 may be, for example, any of the devices and/or integrated circuit (IC) packages described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-6, 7A-7F, 8, 9A-9E, and/or 10-11 may be rearranged and/or combined into a single component, process, feature or function or embodied in several components, processes, or functions. Additional elements, components, processes, and/or functions may also be added without departing from the disclosure. It should also be noted FIGS. 1-6, 7A-7F, 8, 9A-9E, and/or 10-11 and its corresponding description in the present disclosure is not limited to dies and/or ICs. In some implementations, FIGS. 1-6, 7A-7F. 8, 9A-9E, and/or 10-11 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram.

Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A substrate comprising at least one dielectric layer; and a plurality of interconnects located at least partially in the at least one dielectric layer, wherein the plurality of interconnects include a plurality of via interconnects, and wherein the plurality of via interconnects include a first via interconnect comprising a first via wall that is approximately vertical.

Aspect 2: The substrate of aspect 1, wherein the first via interconnect extends through a metal layer of the substrate without touching a pad.

Aspect 3: The substrate of aspects 1 through 2, wherein the plurality of via interconnects include a second via interconnect coupled to the first via interconnect without a pad between the first via interconnect and the second via interconnect.

Aspect 4: The substrate of aspect 3, wherein the first via interconnect has a first diameter and the second via interconnect has a second diameter.

Aspect 5: The substrate of aspects 1, wherein the plurality of via interconnects include a second via interconnect that is located laterally to the first via interconnect, and wherein the first via interconnect has a first diameter and the second via interconnect has a second diameter.

Aspect 6: The substrate of aspects 1 through 5, further comprising a core layer; and a plurality of core via interconnects located in the core layer.

Aspect 7: The substrate of aspect 6, wherein the plurality of core via interconnects include a first core via interconnect comprising a core via wall that is tapered.

Aspect 8: A package comprising an integrated device; and a substrate coupled to the integrated device. The substrate comprises at least one dielectric layer; and a plurality of interconnects located at least partially in the at least one dielectric layer, wherein the plurality of interconnects include a plurality of via interconnects, and wherein the plurality of via interconnects include a first via interconnect comprising a first via wall that is approximately vertical.

Aspect 9: The package of aspect 8, wherein the first via interconnect extends through a metal layer of the substrate without touching a pad.

Aspect 10: The package of aspects 8 through 9, wherein the plurality of via interconnects include a second via interconnect coupled to the first via interconnect without a pad between the first via interconnect and the second via interconnect.

Aspect 11: The package of aspect 10, wherein the first via interconnect has a first diameter and the second via interconnect has a second diameter.

Aspect 12: The package of aspect 8, wherein the plurality of via interconnects include a second via interconnect that is located laterally to the first via interconnect, and wherein the first via interconnect has a first diameter and the second via interconnect has a second diameter.

Aspect 13: The package of aspects 8 through 12, further comprising a core layer; and a plurality of core via interconnects located in the core layer.

Aspect 14: The package of aspect 13, wherein the plurality of core via interconnects include a first core via interconnect comprising a core via wall that is tapered.

Aspect 15: A method for fabricating a substrate, comprising forming a first plurality of interconnects for a first metal layer; forming a first plurality of via interconnects coupled to the first plurality of interconnects; forming a first dielectric layer around the first plurality of interconnects and the first plurality of via interconnects; thinning the first dielectric layer; and forming a second plurality of interconnects for a second metal layer, wherein the second plurality of interconnects are coupled to the first plurality of via interconnects, and wherein the second plurality of interconnects are located laterally to part of the first plurality of via interconnects.

Aspect 16: The method of aspect 15, wherein the first plurality of via interconnects include a first via interconnect comprising a first via wall that is approximately vertical.

Aspect 17: The method of aspects 15 through 16, wherein the first plurality of interconnects are formed on a core layer.

Aspect 18: The method of aspect 17, wherein the core layer includes a seed layer, and wherein the first plurality of interconnects are formed on the seed layer of the core layer.

Aspect 19: The method of aspects 15 through 18, further comprising forming a second plurality of via interconnects coupled to the second plurality of interconnects and the first plurality of via interconnects; forming a second dielectric layer around the second plurality of interconnects and the second plurality of via interconnects; thinning the second dielectric layer; and forming a third plurality of interconnects for a third metal layer, wherein the third plurality of interconnects are coupled to the second plurality of via interconnects, and wherein the third plurality of interconnects are located laterally to part of the second plurality of via interconnects.

Aspect 20: The method of aspect 19, wherein the first plurality of via interconnects include a first via interconnect comprising a first via wall that is approximately vertical, and wherein the second plurality of via interconnects include a second via interconnect comprising a second via wall that is approximately vertical.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A substrate comprising:
- a core layer;
- a plurality of core via interconnects extending through the core layer;
- one or more first dielectric layers coupled to a first surface of the core layer, wherein the one or more first dielectric layers include a different material from the core layer;
- a first plurality of interconnects located at least partially in the one or more first dielectric layers;
- wherein the first plurality of interconnects include:
  - a first plurality of pad interconnects comprising a first pad interconnect; and
  - a first plurality of via interconnects comprising:
    - a first via interconnect coupled to and touching the first pad interconnect; and
    - a second via interconnect coupled to and touching the first pad interconnect, wherein the second via interconnect is located laterally to the first via interconnect, wherein the first via interconnect extends through a metal layer of the substrate, and wherein the first via interconnect comprises a first via wall that has a sidewall angle that is about 87-93 degrees relative to a planar surface of the first pad interconnect.

2. The substrate of claim 1, further comprising:

one or more second dielectric layers coupled to a second surface of the core layer;

a second plurality of interconnects located at least partially in the one or more second dielectric layers, wherein the second plurality of interconnects comprise:

a second plurality of pad interconnects comprising a second pad interconnect; and a second plurality of via interconnects comprising a second via interconnect, wherein the second via interconnect extends through another metal layer of the substrate, and wherein the second via interconnect comprises a second via wall that has a sidewall angle that is about 87-93 degrees relative to a planar surface of the second pad interconnect.

3. The substrate of claim 1, wherein the first plurality of via interconnects include a second via interconnect coupled to the first via interconnect without a pad between the first via interconnect and the second via interconnect.

4. The substrate of claim 3, wherein the first via interconnect has a first diameter and the second via interconnect has a second diameter.

5. The substrate of claim 1, wherein the second via interconnect is coupled to and touching a second pad interconnect, and wherein the first via interconnect has a first diameter and the second via interconnect has a second diameter.

6. The substrate of claim 1, wherein a minimum pitch between the first via interconnect and the second via interconnect is about 40 micrometers.

7. A package comprising:

an integrated device; and a substrate coupled to the integrated device, the substrate comprising:

a core layer;

a plurality of core via interconnects extending through the core layer;

one or more first dielectric layers coupled to a first surface of the core layer;

a first plurality of interconnects located at least partially in the one or more first dielectric layers, wherein the first plurality of interconnects include:

a first plurality of pad interconnects comprising a first pad interconnect;

a first plurality of via interconnects, wherein the first plurality of via interconnects include:

a first via interconnect that is coupled to and touching the first pad interconnect; and a second via interconnect that is coupled to and touching the first pad interconnect, wherein the second via interconnect is laterally adjacent to the first via interconnect, wherein the first via interconnect extends through a metal layer of the substrate, wherein the second via interconnect extends through the metal layer of the substrate, and wherein the first via interconnect comprises a first via wall that is approximately vertical relative to a planar surface of the first pad interconnect.

8. The package of claim 7, further comprising:

one or more second dielectric layers coupled to a second surface of the core layer;

a second plurality of interconnects located at least partially in the one or more second dielectric layers, wherein the second plurality of interconnects comprise:

a second plurality of pad interconnects comprising a second pad interconnect; and a second plurality of via interconnects comprising a third via interconnect, wherein the third via interconnect extends through another metal layer of the substrate, and wherein the third via interconnect comprises a second via wall that has a sidewall angle that is about 87-93 degrees relative to a planar surface of the second pad interconnect.

9. The package of claim 7, wherein the first plurality of via interconnects include a second via interconnect coupled to the first via interconnect without a pad between the first via interconnect and the second via interconnect.

10. The package of claim 9, wherein the first via interconnect has a first diameter and the second via interconnect has a second diameter.

11. The package of claim 7, wherein a minimum pitch between the first via interconnect and the second via interconnect, is about 40 micrometers.

12. The package of claim 7, further comprising a plurality of solder interconnects comprising a first solder interconnect, wherein the integrated device is coupled to the substrate through the plurality of solder interconnects, and wherein the first solder interconnect from the plurality of solder interconnects is coupled to and touching the first via interconnect of the substrate.

13. The package of claim 12, wherein the first via interconnect comprises a first via wall that has a sidewall angle that is about 87-93 degrees relative to the planar surface of the first pad interconnect.

14. The package of claim 7, wherein a registration between the first pad interconnect and the first via interconnect is about 7.5 micrometers.

15. The package of claim 7, wherein a space between the first via interconnect and the second via interconnect is about 15 micrometers.

16. The package of claim 7, wherein the first plurality of interconnects further includes a trace interconnect that is located laterally between the first via interconnect and the second via interconnect.

17. A package comprising:

an integrated device; and a substrate coupled to the integrated device, the substrate comprising:

a core layer;

a plurality of core via interconnects extending through the core layer;

one or more first dielectric layers coupled to a first surface of the core layer;

a first plurality of interconnects located at least partially in the one or more first dielectric layers, wherein the first plurality of interconnects include:

a first plurality of pad interconnects comprising a first pad interconnect;

a first plurality of via interconnects comprising:

a first via interconnect that is coupled to and touching the first pad interconnect; and a second via interconnect that is located laterally to the first via interconnect; and a first trace interconnect located laterally between the first via interconnect and the second via interconnect, wherein the first via interconnect extends through a metal layer of the substrate, wherein the first via interconnect comprises a first via wall that is approximately vertical relative to a planar surface of the first pad interconnect, and wherein a registration between the first pad interconnect and the first via interconnect is about 7.5 micrometers.

18. The package of claim 17, wherein a space between the first via interconnect and the first trace interconnect is about 15 micrometers, and wherein a space between the second via interconnect and the first trace interconnect is about 15 micrometers.

* * * * *